US012751127B2

(12) United States Patent
Kondo et al.

(10) Patent No.: US 12,751,127 B2
(45) Date of Patent: Sep. 29, 2026

(54) SEMICONDUCTOR-LAMINATED SUBSTRATE, LIGHT EMITTING COMPONENT, AND MEASUREMENT APPARATUS

(71) Applicant: FUJIFILM Business Innovation Corp., Tokyo (JP)

(72) Inventors: Takashi Kondo, Kanagawa (JP); Michiaki Murata, Kanagawa (JP); Saori Nishizaki, Kanagawa (JP); Takafumi Higuchi, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 0 days.

(21) Appl. No.: 18/324,994

(22) Filed: May 28, 2023

(65) Prior Publication Data

US 2024/0105882 A1 Mar. 28, 2024

(30) Foreign Application Priority Data

Sep. 27, 2022 (JP) ................................ 2022-154167

(51) Int. Cl.
*H10H 20/80* (2025.01)
*H10H 20/812* (2025.01)
*H10H 20/813* (2025.01)

(52) U.S. Cl.
CPC ........ *H10H 20/862* (2025.01); *H10H 20/812* (2025.01); *H10H 20/813* (2025.01)

(58) Field of Classification Search
CPC ............... H10H 20/862; H10H 20/812; H10H 20/813; H10H 29/10
See application file for complete search history.

(56) References Cited

U.S. PATENT DOCUMENTS 10,468,853 B2 11/2019 Kondo
11,043,530 B2 * 6/2021 Kondo ................. H01S 5/2027

FOREIGN PATENT DOCUMENTS

JP 2018006502 1/2018

OTHER PUBLICATIONS

"Notice of Reasons for Refusal of Japan Counterpart Application", issued on May 26, 2026, with English translation thereof, p. 1-p. 9.

* cited by examiner

*Primary Examiner* — Calvin Y Choi
(74) *Attorney, Agent, or Firm* — JCIPRNET

(57) ABSTRACT

A semiconductor-laminated substrate includes: a substrate; and a laminated structure that includes a first semiconductor laminate which is provided on the substrate and processed into a light emitting element and a second semiconductor laminate which is provided on the first semiconductor laminate and processed into at least one thyristor, in which the laminated structure is adjusted such that two resonant wavelengths due to an effect of the thyristor are located on both sides of a resonant wavelength of the light emitting element.

9 Claims, 11 Drawing Sheets

SEMICONDUCTOR-LAMINATED SUBSTRATE, LIGHT EMITTING COMPONENT, AND MEASUREMENT APPARATUS

CROSS-REFERENCE TO RELATED APPLICATIONS

This application is based on and claims priority under 35 USC 119 from Japanese Patent Application No. 2022-154167 filed Sep. 27, 2022.

BACKGROUND

(i) Technical Field

The present invention relates to a semiconductor-laminated substrate, a light emitting component, and a measurement apparatus.

(ii) Related Art

JP2018-006502A describes a semiconductor-laminated substrate including: a substrate; a first semiconductor laminate that is provided on the substrate and processed into a light emitting element; and a second semiconductor laminate that is provided on the first semiconductor laminate and processed into a driving unit including a thyristor and driving the light emitting element in a case where a tunnel junction layer or a group III-V compound layer having metallic conductivity is interposed therebetween.

SUMMARY

In evaluation of quality of the product including the light emitting element, a resonant wavelength of the light emitting element grasped from the reflection profile of the product is used.

Here, in a case where the light emitting element and the thyristor used for driving the light emitting element are laminated on the same substrate, a reflection profile of the product includes not only a resonance of the light emitting element but also the information of the resonance due to the effect of the thyristor. In such a product, in a case where the resonance of the light emitting element and the resonance due to the effect of the thyristor have the same resonant wavelength, it is difficult to grasp the resonant wavelength of the light emitting element from the reflection profile.

Aspects of non-limiting embodiments of the present disclosure relate to a semiconductor-laminated substrate or the like that makes it easier to grasp the resonant wavelength of the light emitting element compared to the case where the resonance of the light emitting element and the resonance due to the effect of the thyristor have the same resonant wavelength.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present invention, there is provided a semiconductor-laminated substrate including: a substrate; and a laminated structure that includes a first semiconductor laminate which is provided on the substrate and processed into a light emitting element and a second semiconductor laminate which is provided on the first semiconductor laminate and processed into at least one thyristor, in which the laminated structure is adjusted such that two resonant wavelengths due to an effect of the thyristor are located on both sides of a resonant wavelength of the light emitting element.

BRIEF DESCRIPTION OF THE DRAWINGS

Exemplary embodiment(s) of the present invention will be described in detail based on the following figures, wherein:

FIG. 3A is a plan layout view of the light emitting chip, and FIG. 3B is a cross-sectional view taken along a line IIIB-IIIB of FIG. 3A;

FIG. 6A shows a step of forming a semiconductor laminate processed into the VCSEL, FIG. 6B shows a step of forming a tunnel junction layer, and FIG. 6C shows a step of forming a semiconductor laminate processed into a thyristor;

FIG. 7A shows a reflectance spectrum in a case where only a semiconductor laminate is formed on a substrate, and FIG. 7B shows a reflectance spectrum in a case where a laminated structure is formed;

FIG. 9A shows a step of forming the n-ohmic electrode and the like, FIG. 9B shows a step of separating into islands, and FIG. 9C shows a step of exposing the p-gate layer;

FIG. 10D shows a step of forming a p-ohmic electrode or the like, FIG. 10E shows a step of forming a protective layer, and FIG. 10F shows a step of forming various wirings and rear surface electrodes; FIG. 11A is an enlarged cross-sectional view of an island on which a VCSEL and a setting thyristor are laminated in the light emitting chip according to the second exemplary embodiment, and FIG. 11B is a diagram showing a laminated structure of the semiconductor-laminated substrate according to the second exemplary embodiment.

DETAILED DESCRIPTION

Hereinafter, as exemplary embodiments of the present invention, a first exemplary embodiment and a second exemplary embodiment will be described in detail with reference to the accompanying drawings. Any of the exemplary embodiments describes an example of a case where the semiconductor-laminated substrate according to the exemplary embodiment of the present invention is processed into a light emitting chip that is an example of a light emitting component and is applied to a measurement apparatus that measures a three-dimensional shape of a target object.

First Exemplary Embodiment

Measurement Apparatus 1000

First, the first exemplary embodiment of the present invention will be described.

Figure 1:
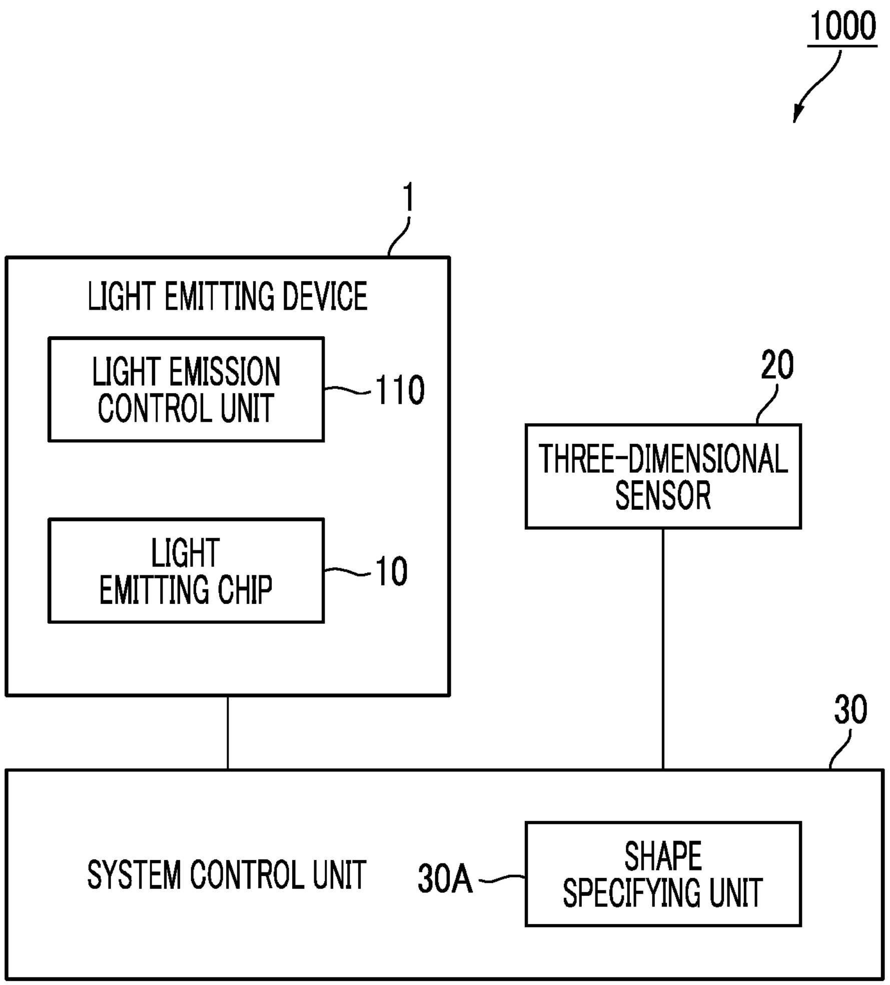
FIG. 1 is a diagram showing an example of a schematic configuration of a measurement apparatus according to an exemplary embodiment of the present invention.

FIG. 1 is a diagram showing an example of a schematic configuration of a measurement apparatus 1000 according to the exemplary embodiment of the present invention.

The measurement apparatus 1000 is an apparatus that measures a three-dimensional shape of the target object on the basis of a so-called time-of-flight (ToF) method on the basis of the flight time of light, and is an example of the measurement apparatus that measures the target object. As shown in the drawing, the measurement apparatus 1000 includes a light emitting device 1 that emits light for measurement, a three-dimensional sensor 20 that receives light reflected by the target object, and a system control unit 30 that controls the measurement apparatus 1000 as a system.

The light emitting device 1 emits light for measurement toward the target object. More specifically, the light emitting device 1 includes a light emitting chip 10 that includes a vertical cavity surface emitting laser (VCSEL) (described later with reference to FIG. 2) which is an example of a light emitting element, and a light emission control unit 110 that controls light emission of the light emitting chip 10.

The light emitting device 1 will be described later in detail with reference to FIGS. 2 to 5.

The three-dimensional sensor 20 acquires light (reflected light) that is reflected and returned by the target object. Then, according to the ToF method, information (distance information) about a distance to the target object is output on the basis of the time from emission of the light to reception of the reflected light. The three-dimensional sensor 20 is an example of a light receiving unit that receives the light that is reflected and returned by the target object.

The system control unit 30 controls the light emitting device 1 and the three-dimensional sensor 20 to control an entire measurement apparatus 1000 as a system. Further, the system control unit 30 includes a shape specifying unit 30A that specifies a three-dimensional shape of the target object on the basis of distance information which is output from the three-dimensional sensor 20. The system control unit 30 is, for example, a computer including a CPU, a ROM, a RAM, and the like. The ROM includes a non-volatile rewritable memory, for example, a flash memory. In addition, the program stored in the ROM is expanded in the RAM, and the CPU executes the program. Thereby, the shape specifying unit 30A is configured.

In the measurement apparatus 1000 according to the exemplary embodiment of the present invention, a time (light flight time) from a timing at which the light emitting device 1 emits light to a timing at which light is reflected by the target object and received by the three-dimensional sensor 20 is measured. On the basis of the time, the distance information is output. Then, the shape specifying unit 30A specifies a three-dimensional shape of the target object on the basis of the distance information which is output from the three-dimensional sensor 20.

In such a manner, the measurement of the three-dimensional shape based on the ToF method is performed in the measurement apparatus 1000. The shape specifying unit 30A is an example of a measurement unit that performs measurement on the target object.

Light Emitting Device 1

Figure 2:
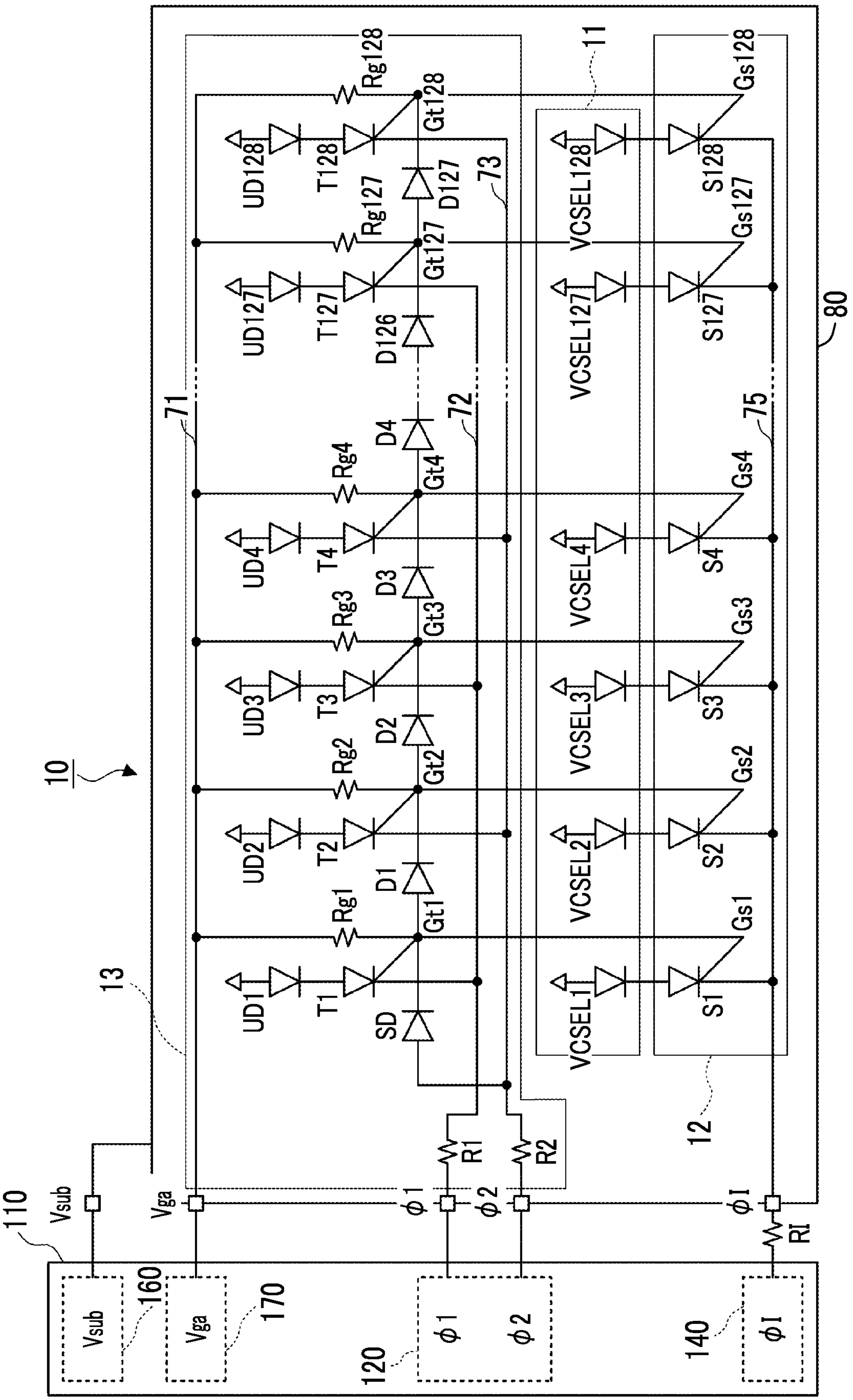
FIG. 2 is a diagram showing a configuration example of a light emitting device according to the exemplary embodiment of the present invention.

FIG. 2 is a diagram for explaining a configuration example of the light emitting device 1 according to the exemplary embodiment of the present invention, and corresponds to an equivalent circuit diagram of the light emitting device 1. As described with reference to FIG. 1, the light emitting device 1 includes the light emitting chip 10 and the light emission control unit 110.

Light Emission Control Unit 110

The light emission control unit 110 includes a transfer signal generating unit 120, a lighting signal generating unit 140, a reference potential supply unit 160, and a power source potential supply unit 170, and controls light emission of the light emitting chip 10.

The transfer signal generating unit 120 generates transfer signals φ1 and φ2 that sequentially transfer an ON state to a plurality of transfer thyristors T (to be described later). The lighting signal generating unit 140 generates a lighting signal φI that supplies a current for lighting (emitting light of) a plurality of VCSELs, which will be described later. The reference potential supply unit 160 supplies a reference potential Vsub. The power source potential supply unit 170 supplies the power source potential Vga.

Light Emitting Chip 10

The light emitting chip 10 includes a light emitting unit 11, a driving unit 12, and a transfer unit 13. Further, the light emitting chip 10 includes a φ1 terminal, a φ2 terminal, a Vga terminal, a φI terminal, and a Vsub terminal, as terminals for receiving signal inputs.

The light emitting unit 11 includes a vertical cavity surface emitting laser VCSEL. Hereinafter, the vertical cavity surface emitting laser VCSEL is simply referred to as "VCSEL". In the example shown in FIG. 2, 128 VCSELs including VCSEL1 to VCSEL4, . . . , VCSEL127, and VCSEL128 (referred to as VCSEL in a case where no distinction is made). The light emitting chip 10 (or the light emitting device 1) emits light to the target object by causing the VCSEL to emit light.

The driving unit 12 includes 128 setting thyristors S1 to S4, . . . , S127, and S128 corresponding to VCSEL1 to VCSEL4, . . . , VCSEL127, and VCSEL128 of the light emitting unit 11 (referred to as the setting thyristor S in a case where no distinction is made). In addition, by connecting the anodes of the VCSELs and the cathodes of the setting thyristors S having the same numbers, the VCSELs and the setting thyristors S having the same numbers are connected in series. The details will be described later with reference to FIG. 3B. However, the setting thyristors S are laminated on the VCSEL formed on the substrate 80. The setting thyristor S is an example of a thyristor that emits light from VCSEL or increases an amount of emitted light in a case where the setting thyristor S is turned on.

It should be noted that the term "on the VCSEL" or "above the VCSEL" does not mean only a state of being in direct contact with the VCSEL, but also includes a state of being positioned above without being in direct contact. The same applies to similar expressions such as the terms "on the substrate" and "above the substrate". Similarly, an expression such as the term "below VCSEL" also includes a state in which the device is located below without direct contact.

The transfer unit 13 includes 128 transfer thyristors T1 to T4, . . . , T127, and T128 (referred to as the transfer thyristor T in a case where no distinction is made), and 128 lower diodes UD1 to UD4, . . . , UD127, and UD128 (referred to as the lower diode UD in a case where no distinction is made). Regarding the transfer thyristors T1 to T128 and the lower diodes UD1 to UD128, the transfer thyristors T and the lower diodes UD having the same numbers are connected in series. The details will be described later with reference to FIG. 3B. However, the transfer thyristor T is laminated on the lower diode UD formed on the substrate 80.

Further, the transfer unit 13 includes pairing two transfer thyristors T1 to T128 in numerical order, and interposing the coupling diodes D1 to D4, . . . , D126, and D127 (referred to as the coupling diode D in a case where no distinction is made) between the pairs. For example, the transfer thyristors T1 and T2 are paired, and the coupling diode D1 is provided between the pairs.

The transfer unit 13 also includes one start diode SD.

Further, the transfer unit 13 includes power source line resistors Rg1 to Rg4, . . . , Rg127, and Rg128 (referred to as the power source line resistor Rg in a case where no distinction is made) and current-limiting resistors R1 and R2 provided to prevent an excessive current from flowing between a first transfer signal line 72 to which a first transfer signal φ1 to be described later is supplied and a second transfer signal line 73 to which a transfer signal φ2 is supplied.

The VCSEL1 to VCSEL128 of the light emitting unit 11, the setting thyristors S1 to S128 of the driving unit 12, the transfer thyristors T1 to T128 of the transfer unit 13, the lower diodes UD1 to UD128, the coupling diodes D1 to D127, and the power source line resistors Rg1 to Rg128 are arranged in numerical order from one side (the left side in FIG. 2) to the other side (the right side in FIG. 2) in the light emitting chip 10.

In the example of FIG. 2, each number of the VCSELs in the light emitting unit 11, the setting thyristors S in the driving unit 12, the transfer thyristors T in the transfer unit 13, the lower diodes UD, and the power source line resistors Rg is set to 128. It should be noted that the number of coupling diodes D is 127, which is smaller by one than the number of transfer thyristors T. Each number of the VCSELs, the setting thyristors S, the transfer thyristors T, the lower diodes UD, the power source line resistors Rg, and the coupling diodes D is not limited to the above, and may be a predetermined number. Further, the number of transfer thyristors T may be greater than the number of the VCSELs.

The VCSEL, the lower diode UD, the coupling diode D, and the start diode SD each are a two-terminal semiconductor element including an anode terminal (anode) and a cathode terminal (cathode). Further, the thyristor (the setting thyristor S or the transfer thyristor T) is a three-terminal semiconductor element including an anode terminal (anode), a gate terminal (gate), and a cathode terminal (cathode). It should be noted that, in the following description, the terminals may be abbreviated and indicated in parentheses.

In the light emitting chip 10 according to the first exemplary embodiment and the light emitting chip 10-2 according to a second exemplary embodiment to be described later, the VCSEL, the setting thyristor S, the lower diode UD, the transfer thyristor T, and the coupling diode D, the power source line resistor Rg, and the start diode SD each are configured as a so-called integrated circuit by a semiconductor laminate epitaxially grown on a common semiconductor substrate (hereinafter, referred to as a substrate 80). Here, the semiconductor laminate is constituted by a group III-V compound semiconductor such as GaAs, AlGaAs, and AlAs, for example.

Hereinafter, a surface of the substrate 80 on which the VCSEL or the like is formed, that is, a surface on which the semiconductor laminate is formed may be referred to as a "front surface", and an opposite surface thereof may be referred to as a "rear surface".

Next, electrical connection of each element in the light emitting chip 10 will be described.

Each anode of the VCSEL and the lower diode UD is connected to the substrate 80 and is constituted by a so-called anode common. The reference potential Vsub is supplied to the anodes via a rear surface electrode 91 which is a Vsub terminal provided on the rear surface of the substrate 80. Then, each cathode of the VCSEL is connected to the anode of the setting thyristor S. Further, each cathode of the lower diode UD is connected to the anode of the transfer thyristor T.

It should be noted that the connection is a configuration example in a case where the p-type substrate 80 is used. In a case where an n-type substrate is used, the polarities are reversed. In a case where an intrinsic (i) type substrate to which no impurities are added is used, a terminal for supplying the reference potential Vsub is provided on the front surface of the substrate.

According to arrangement of the transfer thyristors T, the cathodes of the transfer thyristors T1, T3, T5, . . . , T125, and T127 having odd numbers are connected to the first transfer signal line 72. Then, the first transfer signal line 72 is connected to the φ1 terminal with the current-limiting resistor R1 interposed therebetween. A first transfer signal φ1 is supplied to the φ1 terminal from the transfer signal generating unit 120 of the light emission control unit 110.

Further, along the arrangement of the transfer thyristors T, the cathodes of the even-numbered transfer thyristors T2, T4, T6, . . . , T126, and T128 are connected to the second transfer signal line 73. Then, the second transfer signal line 73 is connected to the φ2 terminal with the current-limiting resistor R2 interposed therebetween. A second transfer signal φ2 is supplied to the φ2 terminal from the transfer signal generating unit 120 of the light emission control unit 110.

Each cathode of the setting thyristor S is connected to a lighting signal line 75. The lighting signal line 75 is connected to the φI terminal. In the light emitting chip 10, the φI terminal is supplied with the lighting signal φI from the lighting signal generating unit 140 of the light emission control unit 110 with the current-limiting resistor RI interposed therebetween and provided on the outside of the light emitting chip 10. The lighting signal φI supplies a current for lighting (emitting light) of the VCSEL.

Respective gates Gt1 to Gt128 of the transfer thyristors T1 to T128 (referred to as gates Gt in a case where no distinction is made) are connected one-to-one to gates Gs1 to Gs128 of the setting thyristors S1 to S128 with the same numbers (referred to as gates Gs in a case where no distinction is made). Consequently, the gates Gt1 to Gt128 and the gates Gs1 to Gs128 having the same number have electrically the same potential. Accordingly, for example, the gate Gt1 (gate Gs1) is noted to indicate that the electric potentials are the same.

The coupling diodes D1 to D127 are connected between the gates Gt in which the gates Gt1 to Gt128 of the transfer thyristors T1 to T128 are paired by two in numerical order. That is, the coupling diodes D1 to D127 are directly connected so as to be interposed between the gates Gt1 to Gt128, respectively. Then, the direction of the coupling diode D1 is connected in a direction in which a current flows from the gate Gt1 to the gate Gt2. The same configuration is applied to the other coupling diodes D2 to D127.

The gate Gt (gate Gs) of the transfer thyristor is connected to a power source line 71 with the power source line resistor Rg interposed therebetween and provided corresponding to each of the transfer thyristors T. The power source line 71 is connected to the Vga terminal. The power source potential Vga is supplied to the Vga terminal from the power source potential supply unit 170 of the light emission control unit 110.

The gate Gt1 of the transfer thyristor T is connected to the cathode of the start diode SD. On the other hand, the anode of the start diode SD is connected to the second transfer signal line 73.

Figure 3B:
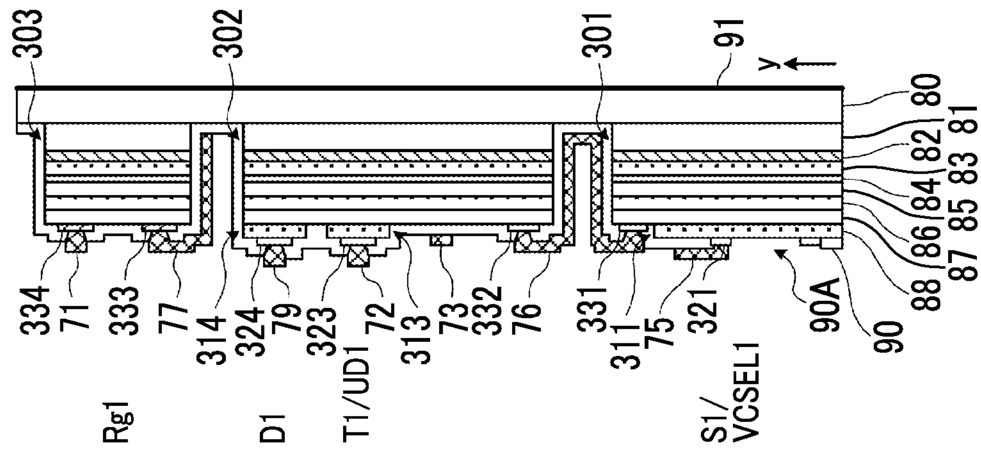
FIGS. 3A and 3B are examples of a plan layout view and a cross-sectional view of a light emitting chip according to a first exemplary embodiment.
Figure 3A:
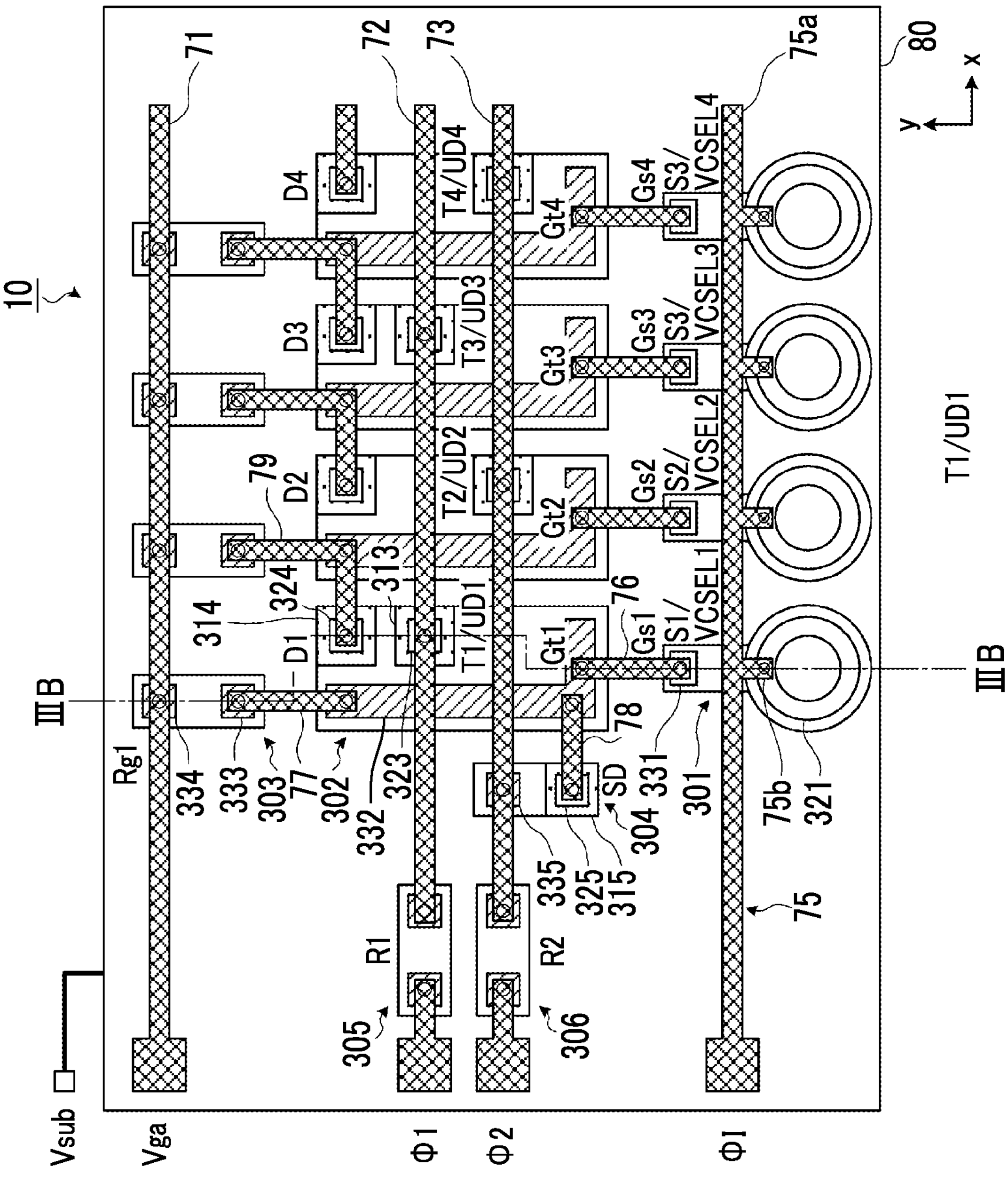

FIGS. 3A and 3B are examples of a plan layout view and a cross-sectional view of the light emitting chip 10 according to the first exemplary embodiment. FIG. 3A is a plan layout view of the light emitting chip 10, and FIG. 3B is a cross-sectional view taken along a line IIIB-IIIB of FIG. 3A. The right side in FIG. 3A is the +x direction, the upper side is the +y direction, and the upper side in FIG. 3B is the +y direction. In FIG. 3A, the protective layer 90 to be described later is omitted.

FIG. 3A shows a part centered on the VCSEL1 to VCSEL4, the setting thyristors S1 to S4, the transfer thyristors T1 to T4, and the lower diodes UD1 to UD4. It should be noted that, for convenience, FIG. 3 shows an example in which the VCSELs are arranged in a single row (the x-direction in FIG. 3A). However, the arrangement of the VCSELs is not limited, and for example, the VCSELs may be two-dimensionally arranged in the x-direction and the y-direction.

Further, FIG. 3 shows that the Vsub terminal (rear surface electrode 91) provided on the rear surface of the substrate 80 is drawn out of the substrate 80.

FIG. 3B, which is a cross-sectional view taken along the line IIIB-IIIB in FIG. 3A, shows the setting thyristor S1/VCSEL1, the transfer thyristor T1/the lower diode UD1, the coupling diode D1, and the power source line resistor Rg1 from the lower side (−y direction) in the drawing. The setting thyristor S1 and the VCSEL1 are laminated. Similarly, the transfer thyristor T1 and the lower diode UD1 are laminated.

First, a cross-sectional structure of the light emitting chip 10 will be described with reference to FIG. 3B.

In the light emitting chip 10, a p-type anode layer 81, a light emission layer 82, and an n-type cathode layer 83 constituting the VCSEL and the lower diode UD are sequentially provided on the p-type substrate 80 (substrate 80). Although details will be described later, in the light emitting chip 10, the p-type anode layer 81 and the n-type cathode layer 83 are constituted by distributed Bragg reflection layers (DBR: Distributed Bragg Reflector) on which a plurality of semiconductor layers with different refractive indexes are laminated (hereinafter, referred to as DBR layers). Consequently, in the following description, a p-type anode layer 81 will be referred to as a p-anode (DBR) layer 81, and an n-type cathode layer 83 will be referred to as an n-cathode (DBR) layer 83.

Further, a tunnel junction (tunnel diode) layer 84 (tunnel junction layer 84) is provided on the n-cathode (DBR) layer 83.

Furthermore, a p-type anode layer 85 (p-anode layer 85) constituting the setting thyristor S, the transfer thyristor T, the coupling diode D, and the power source line resistor Rg, an n-type gate layer 86 (n-gate layer 86), a p-type gate layer 87 (p-gate layer 87), and an n-type cathode layer 88 (n-cathode layer 88) are provided on the tunnel junction layer 84 in this order.

It should be noted that, in the following description, the notation in parentheses will be used. The same configuration is applied to other cases.

Further, as shown in FIG. 3B, the light emitting chip 10 has a protective layer 90 constituted by an insulating material so as to cover the front surface and the side surface of each island. Furthermore, in the protective layer 90, a light emitting port 90A for emitting light emitted by the VCSEL is provided on a surface of the VCSEL opposite to the substrate 80. In other words, in the example of FIG. 3B, a part of the n-cathode layer 88 of the setting thyristor S is not covered with the protective layer 90.

Elements such as the VCSEL, the lower diode UD, the setting thyristor S, the transfer thyristor T, and the coupling diode D are constituted of a plurality of islands 301, 302, and 303 separated by removing a part of each of the above layers through etching. The island may be referred to as a mesa, and the etching, which forms an island (mesa), may be referred to as a mesa etching.

In the light emitting chip 10, the islands 301, 302, and 303 and wirings such as the power source line 71, a first transfer signal line 72, a second transfer signal line 73, and a lighting signal line 75 are connected via a through-hole (indicated by "o" in FIG. 3A) provided in the protective layer 90. In the following description, the protective layer 90 and the through-hole will not be described.

Further, as shown in FIG. 3B, the rear surface electrode 91 serving as the Vsub terminal is provided on the rear surface of the substrate 80.

Here, the notation of the p-anode (DBR) layer 81 and the n-cathode (DBR) layer 83 corresponds to functions (actions) in a case where the layers constitute the VCSEL and the lower diode UD. That is, the p-anode (DBR) layer 81 functions as an anode, and the n-cathode (DBR) layer 83 functions as a cathode. Further, the notations of the p-anode layer 85, the n-gate layer 86, the p-gate layer 87, and the n-cathode layer 88 correspond to functions (actions) in a case where the layers constitute the setting thyristor S and the transfer thyristor T. That is, the p-anode layer 85 functions as an anode, the n-gate layer 86 and the p-gate layer 87 function as a gate, and the n-cathode layer 88 functions as a cathode.

In addition, in a case where each of the above-mentioned layers constitutes the coupling diode D and the power source line resistor Rg, the layers have different functions as described later.

In addition, the plurality of islands included in the light emitting chip 10 include islands which do not include a part of the layer among the p-anode (DBR) layer 81, the light emission layer 82, the n-cathode (DBR) layer 83, the tunnel junction layer 84, and the p-anode layer 85, the n-gate layer 86, the p-gate layer 87, and the n-cathode layer 88. For example, the island 301 does not include a part of the n-cathode layer 88.

Next, an example of a plan layout of the light emitting chip 10 will be described.

As shown in FIG. 3A, the island 301 is provided with the VCSEL1 and the setting thyristor S1. The island 302 is provided with the lower diode UD1, the transfer thyristor T1, and the coupling diode D1. The island 303 is provided with the power source line resistor Rg1. The island 304 is provided with the start diode SD. Further, the island 305 is provided with the current-limiting resistor R1 and the island 306 is provided with the current-limiting resistor R2.

The plurality of islands similar to the islands 301, 302, and 303 are formed in parallel on the light emitting chip 10. The VCSEL2 to VCSEL128, the setting thyristors S2 to S128, the lower diodes UD2 to UD128, the transfer thyristors T2 to T128, the coupling diodes D2 to D127, and the like are provided in the islands in the same manner as the islands 301, 302, and 303.

Here, the islands 301 to 306 will be described in detail with reference to FIGS. 3A and 3B.

As shown in FIG. 3B, the VCSEL1 provided in the island 301 is constituted of the p-anode (DBR) layer 81, the light emission layer 82, and the n-cathode (DBR) layer 83. Further, the setting thyristor S is constituted of the p-anode layer 85, the n-gate layer 86, the p-gate layer 87, and the n-cathode layer 88 which are laminated with the tunnel junction layer 84 interposed therebetween and laminated on the n-cathode (DBR) layer 83 of the VCSEL1.

Then, in the island 301, an n-type ohmic electrode 321 (n-ohmic electrode 321) provided on the n-cathode layer 88 (region 311) is used as the cathode electrode. Further, a p-type ohmic electrode 331 (p-ohmic electrode 331) provided on the p-gate layer 87 exposed by removing the n-cathode layer 88 is set as an electrode of the gate Gs1 (may be referred to as the gate terminal Gs1).

In addition, the n-ohmic electrode 321 is provided so as not to block the light emitted from the VCSEL1 and may include, for example, a light emitting port (unsigned) similar to the protective layer 90. In the example of FIG. 3B, the light emitting port 90A of the protective layer 90 and the light emitting port of the setting thyristor S are provided in the corresponding portions, and a part of the n-cathode layer 88 is exposed without being covered with the protective layer 90 and the n-ohmic electrode 321.

Here, the p-anode (DBR) layer 81 of the VCSEL may include a current constriction layer that constricts the current. The current constriction layer is formed by forming a current blocking portion in which a current is unlikely to flow by oxidizing a part of a semiconductor layer constituting the p-anode (DBR) layer exposed through mesa etching from the outer periphery. The central portion, in which the semiconductor layer constituting the p-anode (DBR) layer is not oxidized, is a current passage portion through which a current is likely to flow through the current blocking portion. Since the current blocking portion may be any as long as the current blocking portion is able to concentrate the current in the current passage portion, it is not necessary to completely block the current, and it is sufficient that the current is unlikely to flow than the current passage portion.

By providing such a current blocking portion, it is possible to reduce power consumption and improve a light extraction efficiency. The light extraction efficiency refers to an amount of light that can be extracted per power.

In a similar manner to the VCSEL, the lower diode UD1 provided in the island 302 is constituted of the p-anode (DBR) layer 81, the light emission layer 82, and the n-cathode (DBR) layer 83. In a similar manner to the setting thyristor S1, the transfer thyristor T1 is constituted of the p-anode layer 85, the n-gate layer 86, and the p-gate layer 87, and the n-cathode layer 88, which are laminated with the tunnel junction layer 84 interposed therebetween and laminated on the n-cathode (DBR) layer 83 of the lower diode UD1. In addition, an n-ohmic electrode 323, which is provided on a region 313 of the n-cathode layer 88, is set as a cathode terminal. Further, a p-ohmic electrode 332, which is provided on the p-gate layer 87 exposed by removing the n-cathode layer 88, is used as a terminal of the gate Gt1.

In a similar manner, the coupling diode D1, which is provided in the island 302, is constituted of the p-gate layer 87 and the n-cathode layer 88. Further, an n-ohmic electrode 324, which is provided on a region 314 of the n-cathode layer 88, is used as a cathode terminal. Further, the p-ohmic electrode 332, which is provided on the p-gate layer 87 exposed by removing the n-cathode layer 88, is used as an anode terminal. Here, the anode terminal of the coupling diode D is the same as the gate Gt1.

The power source line resistor Rg1 provided on the island 303 is constituted by the p-gate layer 87. That is, the power source line resistor Rg1 is provided with the p-gate layer 87 between the p-ohmic electrode 333 and the p-ohmic electrode 334 provided on the p-gate layer 87 exposed by removing the n-cathode layer 88 as a resistor.

The start diode SD, which is provided in the island 304, is constituted of the p-gate layer 87 and the n-cathode layer 88. That is, in the start diode SD, an n-ohmic electrode 325 provided on a region 315 of the n-cathode layer 88 serves as a cathode terminal. Further, a p-ohmic electrode 335, which is provided on the p-gate layer 87 exposed by removing the n-cathode layer 88, is used as an anode terminal.

The current-limiting resistor R1 provided in the island 305 and the current-limiting resistor R2 provided in the island 306 are provided in the same manner as the power source line resistor Rg1 provided in the island 303, and each resistor uses the p-gate layer 87 between the two p-ohmic electrodes (unsigned) as a resistance.

Next, a connection relationship between the elements will be described with reference to FIG. 3A.

The lighting signal line 75 includes a trunk portion 75*a* and a plurality of branch portions 75*b*. The trunk portion 75*a* is provided so as to extend in the row direction of the setting thyristors S/VCSEL. The branch portion 75*b* is branched from the trunk portion 75*a* and is connected to the n-ohmic electrode 321 which is a cathode terminal of the setting thyristor S1 provided in the island 301. The same configuration is applied to the cathode terminals of the other setting thyristors S. The lighting signal line 75 is connected to the YI terminal which is provided on the setting thyristor S1/VCSEL1 side.

The first transfer signal line 72 is connected to the n-ohmic electrode 323 as a cathode terminal of the transfer thyristor T1 which is provided in the island 302. The cathode terminal of another transfer thyristor T having an odd number, which is provided on an island similar to the island 302, is connected to the first transfer signal line 72. The first transfer signal line 72 is connected to the φ1 terminal with the current-limiting resistor R1 interposed therebetween and provided in the island 305.

Further, the second transfer signal line 73 is connected to the n-ohmic electrode (unsigned) which is the cathode terminal of the even-numbered transfer thyristor T. The second transfer signal line 73 is connected to the φ2 terminal with the current-limiting resistor R2 interposed therebetween and provided in the island 306.

The power source line 71 is connected to the p-ohmic electrode 334 as one terminal of the power source line resistor Rg1 which is provided in the island 303. One terminal of another power source line resistor Rg is also connected to the power source line 71. The power source line 71 is connected to the Vga terminal.

The p-ohmic electrode 331 (gate terminal Gs1) of the setting thyristor S1, which is provided in the island 301, is connected to the p-ohmic electrode 332 (gate terminal Gt1) of the island 302 through a connection wiring 76.

Further, the p-ohmic electrode 332 (gate terminal Gt1) is connected to the p-ohmic electrode 333 (the other terminal of the power source line resistor Rg1) of the island 303 through a connection wiring 77.

Furthermore, the n-ohmic electrode 324 (cathode terminal of the coupling diode D1), which is provided in the island 302, is connected to a p-type ohmic electrode (unsigned) as the gate terminal Gt2 of the adjacent transfer thyristor T2 through a connection wiring 79.

Although description is not given here, it is the same for other VCSELs, the setting thyristor S, the transfer thyristor T, the coupling diode D, and the like.

The p-ohmic electrode 332 (gate terminal Gt1) of the island 302 is connected to the n-ohmic electrode 325 (cathode terminal of the start diode SD) provided in the island 304 through a connection wiring 78. The p-ohmic electrode 335 (the anode terminal of the start diode SD) is connected to the second transfer signal line 73.

It should be noted that the above-mentioned connection and configuration are for a case of using the p-type substrate 80, and the polarities thereof are opposite to each other in a case of using the n-type substrate. Further, in a case where an i-type substrate is used, a terminal for supplying the reference potential Vsub is provided on the front surface of the substrate. In addition, the connection and configuration are the same as either in the case of using the p-type substrate or in the case of using the n-type substrate.

Laminated Structure L1

Figure 4:
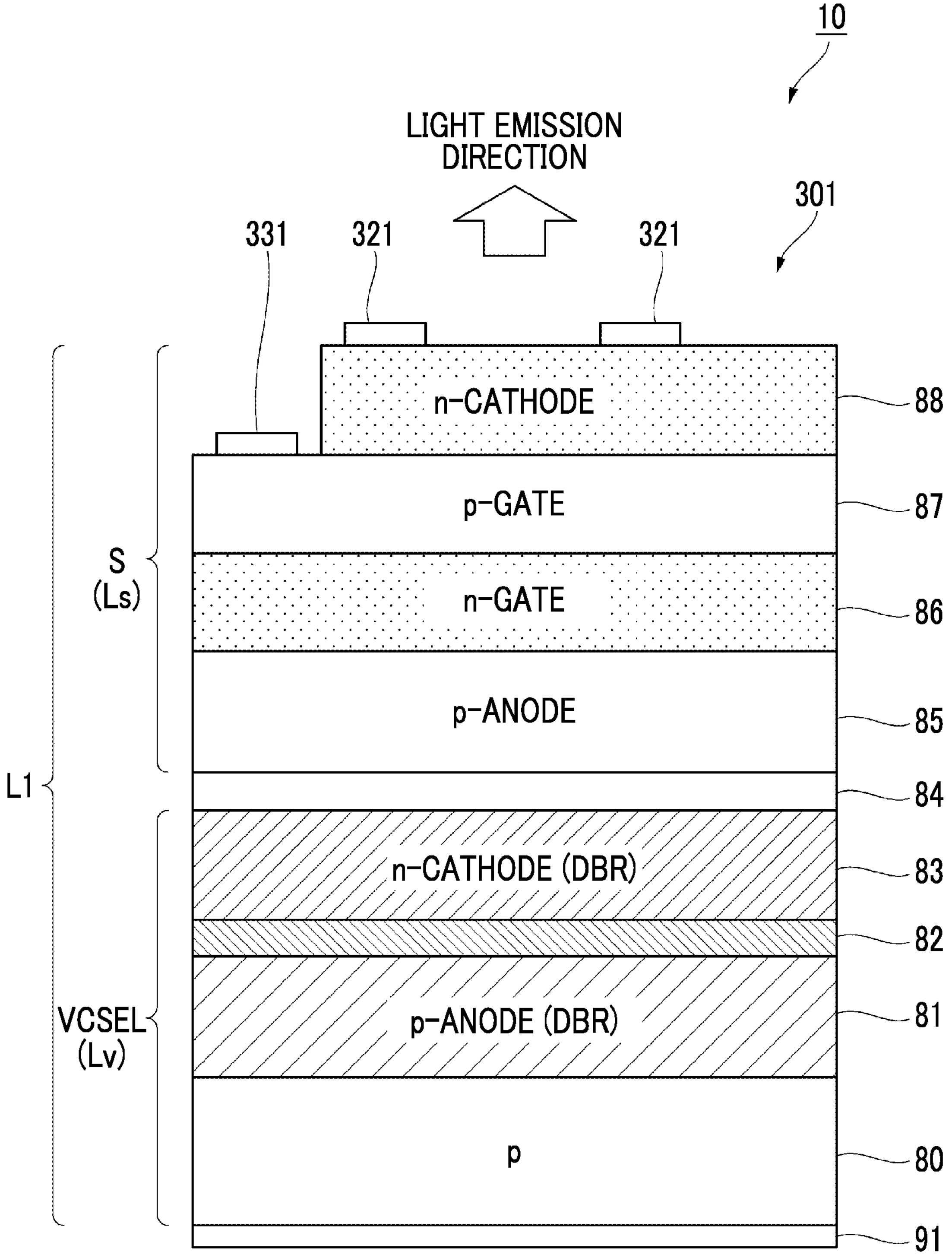
FIG. 4 is an enlarged cross-sectional view of an island in which a VCSEL and a setting thyristor are laminated in the light emitting chip according to the first exemplary embodiment.

FIG. 4 is an enlarged cross-sectional view of the island 301 in which the VCSEL and the setting thyristor S are laminated in the light emitting chip 10 according to the first exemplary embodiment, and corresponds to a view of a cross unit viewed from a −y direction. Since the p-ohmic electrode 331 is hidden in the state, a part of the p-ohmic electrode 331 is taken as a view viewed from a −x direction in FIG. 3A. It should be noted that the protective layer 90 is omitted.

As described above, in the island 301 of the light emitting chip 10, the setting thyristor S is laminated on the VCSEL with the tunnel junction layer 84 interposed therebetween. In other words, a laminated structure L1, which includes a semiconductor laminate Lv constituting the VCSEL, a tunnel junction layer 84, and a semiconductor laminate Ls constituting the setting thyristor S, is formed on the substrate 80.

Here, in the light emitting chip 10, the semiconductor laminate Lv is an example of a first semiconductor laminate constituting the light emitting element, and the semiconductor laminate Ls is an example of a second semiconductor laminate constituting the thyristor. The laminated structure L1 is an example of a laminated structure including the first semiconductor laminate and the second semiconductor laminate.

VCSEL/Semiconductor Laminate Lv

As shown in FIG. 4, the VCSEL is constituted by a semiconductor laminate Lv in which the p-anode (DBR) layer 81, the light emission layer 82, and the n-cathode (DBR) layer 83 are epitaxially grown on the p-type substrate 80 in order.

The p-anode (DBR) layer 81 and the n-cathode (DBR) layer 83 are DBR layers in which a plurality of high refractive index layers each having a relatively high refractive index and a plurality of low refractive index layers each having a relatively low refractive index are alternately laminated. Then, the p-anode (DBR) layer 81 and the n-cathode (DBR) layer 83 are configured to reflect the light emitted by the VCSEL. As described above, the p-anode (DBR) layer 81 may include the current constriction layer that constricts the current.

The light emission layer 82 is a quantum well structure, in which well layers and barrier layers are alternately laminated. The light emission layer 82 may be an intrinsic (i) type layer (i layer), to which no impurities are added. Further, the light emission layer 82 may have a structure other than the quantum well structure, and may be, for example, a quantum ray (quantum wire) or a quantum box (quantum dot).

In the VCSEL, laser oscillation is realized by resonating light at a resonant wavelength λv through two DBR layers (the p-anode (DBR) layer 81 and the n-cathode (DBR) layer 83) with the light emission layer 82 interposed therebetween. Then, this light passes through the setting thyristor S and is emitted from the light emitting port 90A (refer to FIG. 3).

The tunnel junction layer 84 has a junction between an $n^{++}$ layer to which n-type impurities (dopant) are added at a high concentration and a $p^{++}$ layer to which p-type impurities are added at a high concentration. Through the junction, current flows due to the tunnel effect even in reverse bias. The tunnel junction layer 84 suppresses a case where the n-cathode (DBR) layer 83 of the VCSEL and the setting thyristor S have a reverse bias and the current is unlikely to flow. Even with the reverse bias, current flows due to the tunnel effect.

Setting Thyristor S/Semiconductor Laminate Ls

The setting thyristor S is constituted by the semiconductor laminate Ls in which the p-anode layer 85, the n-gate layer 86, the p-gate layer 87, and the n-cathode layer 88 laminated on the tunnel junction layer 84 are epitaxially grown in order. That is, the structure thereof is a four-layer structure of pnpn.

Here, in the light emitting chip 10 according to the first exemplary embodiment, the n-cathode layer 88 is formed to be thicker than the n-gate layer 86 and the p-gate layer 87 in accordance with the adjustment of the laminated structure L1 to be described later with reference to FIGS. 6 and 7. Further, the p-anode layer 85 is thicker than the n-cathode layer 88. That is, in a case where the thickness of each layer in the semiconductor laminate Ls constituting the setting thyristor S is represented by t(i) using the reference numeral i of each semiconductor layer, t(86), t(87)<t(88)<t(85).

In the above description, the p-gate layer 87 is provided with the ohmic electrode 331 to provide the gate Gs of the setting thyristor S. However, the n-gate layer 86 may be provided with the n-ohmic electrode to provide the gate Gs of the setting thyristor S.

Subsequently, basic operations of the thyristor (transfer thyristor T, setting thyristor S) will be described with reference to FIGS. 2 to 4.

As described above, the thyristor is a semiconductor element having three terminals including the anode terminal (anode), the cathode terminal (cathode), and the gate terminal (gate), and has a pnpn structure constituted by laminating the p-type semiconductor layers (the p-anode layer 85, the p-gate layer 87) and the n-type semiconductor layers (the n-gate layer 86, the n-cathode layer 88) on the substrate 80. Here, it is assumed that a forward electric potential (diffusion electric potential) Vd of a pn junction constituted of the p-type semiconductor layer and the n-type semiconductor layer is 1.5V as an example.

Further, the following description will be given, for example, under the following assumptions. The reference potential Vsub supplied to the rear surface electrode 91 which is a Vsub terminal is set to 0V as a high-level potential (hereinafter referred to as "H"). The power source potential Vga supplied to the Vga terminal is set to −5V as a low-level potential (hereinafter referred to as "L"). Accordingly, the electric potentials may be noted as "H" (0V) or "L" (−5V).

First, an operation of a single thyristor will be described. Here, the anode of the thyristor is set to 0V. The thyristor in an OFF state in which no current flows between an anode and the cathode transitions to an ON state (turns on) in a case where an electric potential lower than a threshold voltage (a negative electric potential having a large absolute value) is applied to the cathode. Here, a threshold voltage of the thyristor is a value obtained by subtracting the forward electric potential Vd (1.5V) of the pn junction from the electric potential of the gate.

In the ON state, the gate of the thyristor has an electric potential close to an electric potential of the anode terminal. Here, since the anode is set to 0V, the gate is supposed to be 0V. Further, the cathode of the thyristor in the ON state has an electric potential close to an electric potential obtained by subtracting the forward electric potential Vd (1.5V) of the pn junction from an electric potential of the anode. Here, since the anode is set to 0V, the cathode of the thyristor in the ON state has an electric potential close to −1.5V (a negative electric potential having an absolute value greater than 1.5V). It should be noted that the electric potential of the cathode is set in relation to the power source that supplies a current to the thyristor in the ON state.

In a case where the cathode of the thyristor in the ON state is set to an electric potential (a negative electric potential with a small absolute value, 0 V, or a positive electric potential) higher than the electric potential (an electric potential close to −1.5 V described above) required to maintain the ON state, the thyristor transitions (is turned off) to the OFF state.

In contrast, in a case where an electric potential lower than the electric potential required to maintain the ON state (a negative electric potential with a large absolute value) is continuously applied to the cathode of the thyristor in the ON state and a current capable of maintaining the ON state (maintenance current) is supplied, the thyristor maintains the ON state.

Next, an operation thereof in a state where the VCSEL and the setting thyristor S are laminated will be described.

The setting thyristor S and the VCSEL are laminated and connected in series. Accordingly, an electric potential of the lighting signal φI is divided between the VCSEL and the setting thyristor S. Here, a voltage applied to the VCSEL as a result of the voltage division will be described assuming that the voltage is −1.7V. Then, in a case where the setting thyristor S is in the OFF state, −3.3V is applied to the setting thyristor S.

As described above, in a case where an absolute value of the threshold voltage of the setting thyristor S in the OFF state is greater than an absolute value of −3.3V, the electric potential applied to the cathode of the setting thyristor S is lower than the threshold voltage. Thus, the setting thyristor S is turned on. Then, the current flows through the VCSEL and the setting thyristor S connected in series, and the VCSEL emits light. In contrast, in a case where the absolute value of the threshold voltage of the setting thyristor S is smaller than the absolute value of −3.3V, the setting thyristor S is not turned on and maintains the OFF state.

It should be noted that in a case where the setting thyristor S is turned on, the current-limiting resistor RI lowers an absolute value of the voltage applied to the VCSEL and the setting thyristor S connected in series. However, in a case where the voltage applied to the setting thyristor S is a voltage which maintains the ON state of the setting thyristor S, the setting thyristor S maintains the ON state. Thereby, the VCSEL also continues to emit light.

Operations of Light Emitting Device 1

Subsequently, the operations of the light emitting device 1 will be described with reference to FIGS. 1 to 5.

Figure 5:
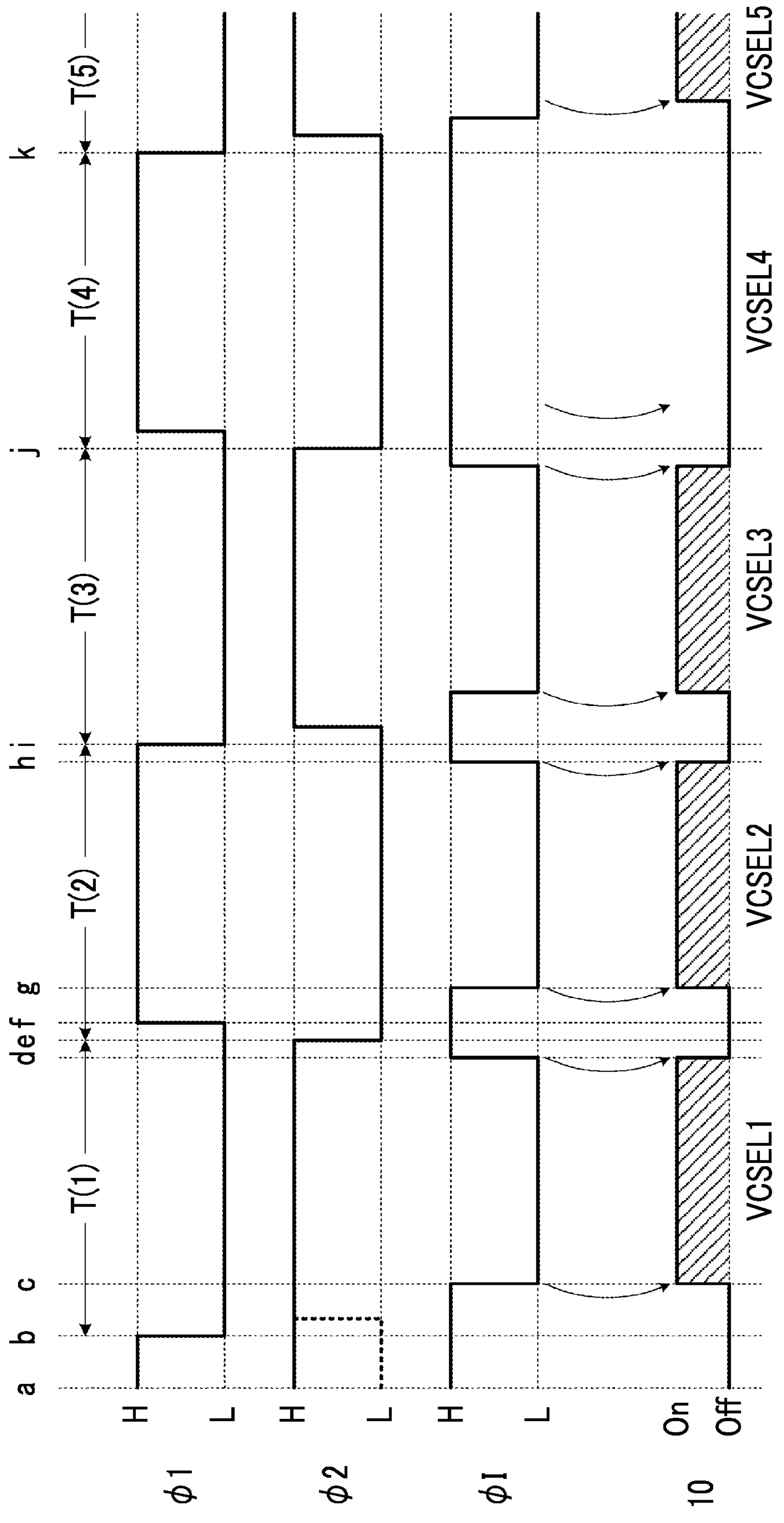
FIG. 5 is a timing chart showing an example of operations of the light emitting device and the light emitting chip.

FIG. 5 is a timing chart showing an example of operations of the light emitting device 1 and the light emitting chip 10. FIG. 5 is a timing chart of a part of the light emitting chip 10 for controlling lighting (light emission)/non-lighting (non-light emission) of the five VCSELs including VCSEL1 to VCSEL5. In FIG. 5, VCSEL1, VCSEL2, and VCSEL3 are turned on (emit light), and VCSEL4 is turned off (does not emit light).

In FIG. 5, it is assumed that the time elapses from a time a to a time k in alphabetical order. In such a case, the VCSEL1 is subjected to control of lighting or non-lighting (referred to as lighting control) in a period T(1), the VCSEL2 is subjected to control of lighting or non-lighting in a period T(2), the VCSEL3 is subjected to control of lighting or non-lighting in a period T(3), and the VCSEL4 is subjected to control of lighting or non-lighting in a period T(4). In addition, the periods T(1), T(2), T(3), . . . are defined as periods having the same length, and are referred to as period T in a case where the periods are not distinguished from each other.

In the following description, "H" (0V) and "L" (−5V) may be abbreviated as "H" and "L".

The first transfer signal φ1 transmitted to the e 1 terminal and the second transfer signal φ2 transmitted to the φ2 terminal are signals having the two potentials of "H" and "L". In addition, waveforms of the first transfer signal φ1 and the second transfer signal φ2 are repeated with two consecutive periods T (for example, period T(1) and period T(2)) as units.

The first transfer signal φ1 transitions from "H" to "L" at a start time b in the period T(1), and transitions from "L" to "H" at a time f. Then, at an end time i in the period T(2), the transition from "H" to "L" occurs.

The second transfer signal φ2 is "H" (0V) at the start time b in the period T(1), and transitions from "H" to "L" at a time e. Then, transition from "L" to "H" occurs at the end time i in the period T(2).

Comparing the first transfer signal φ and the second transfer signal φ2, the second transfer signal φ2 corresponds to a signal obtained by shifting back the first transfer signal φ1 by the period T on the time axis. In contrast, a waveform of the second transfer signal φ2 indicated by the broken line in the period T(1) and a waveform thereof in the period T(2) are repeated in the period T(3) and thereafter. The waveform of the second transfer signal φ2 in the period T(1) is different from the waveform thereof in the period T(3) and thereafter. The reason for this is that the period T(1) is a period during which the light emitting device 1 starts an operation.

As described later, a pair of transfer signals including the first transfer signal φ1 and the second transfer signal φ2 propagates the ON states of the transfer thyristor T in numerical order, thereby specifying the VCSEL, which has the same number as the transfer thyristor T in the ON state, as a target of lighting or non-lighting (lighting control).

Next, a lighting signal φI supplied to the φI terminal will be described. The lighting signal φI is a signal having two potentials including "H" and "L".

Here, the lighting signal φI will be described in the period T(1) of the lighting control for the VCSEL1. The lighting signal φI is at "H" at the start time b in the period T(1), and transitions from "H" to "L" at a time c. Then, transition from "L" to "H" occurs at a time d, and "H" is maintained at the time e.

(1) Time a

At the time a, the reference potential supply unit 160 of the light emission control unit 110 of the light emitting device 1 sets the reference potential Vsub to "H". The power source potential supply unit 170 of the light emission control unit 110 sets the power source potential Vga to "L". The transfer signal generating unit 120 of the light emission control unit 110 sets each of the first transfer signal φ1 and the second transfer signal φ2 to "H". Thereby, the φ1 terminal and the φ2 terminal of the light emitting chip 10 are changed to "H". The electric potential of the first transfer signal line 72 connected to the φ1 terminal with the current-limiting resistor R1 interposed therebetween is also "H", and the second transfer signal line 73 connected to the φ2 terminal with the current-limiting resistor R2 interposed therebetween is also at "H".

Then, the lighting signal generating unit 140 of the light emission control unit 110 sets the lighting signal φI to "H". Thereby, the φI terminal of the light emitting chip 10 is changed to "H" via the current-limiting resistor RI, and the lighting signal line 75 connected to the φI terminal is also at "H".

The anode (p-anode layer 85) of the setting thyristor S is connected to the cathode (n-cathode (DBR) layer 83) of the VCSEL with the tunnel junction layer 84 interposed therebetween, and the anode of the VCSEL (p-anode (DBR) layer 81) is connected to the Vsub terminal which is set to "H".

The anode (p-anode layer 85) of the transfer thyristor T is connected to the cathode (n-cathode (DBR) layer 83) of the lower diode UD with the tunnel junction layer 84 interposed therebetween, and the anode of the lower diode UD (p-anode (DBR) layer 81) is connected to the Vsub terminal which is set to "H".

Each cathode of the transfer thyristors T1, T3, and T5 having an odd number is connected to the first transfer signal line 72 and is set to "H". Each cathode of the even-numbered transfer thyristors T2, T4, and T6 is connected to the second transfer signal line 73 and is set to "H". Accordingly, both the anode and the cathode of the transfer thyristor T are changed to "H" in the OFF state. Further, both the anode and the cathode of the lower diode UD are changed to "H" and the lower diode UD is also in the OFF state.

The cathode terminal of the setting thyristor S is connected to the lighting signal line 75 of "H" (0V). Accordingly, both the anode and the cathode of the transfer thyristor T are changed to "H", and the setting thyristor S is in the OFF state. Further, both the anode and the cathode of the VCSEL are set to "H" and the VCSEL is in the OFF state.

As described above, the gate Gt1 is connected to the cathode of the start diode SD. The gate Gt1 is connected to the power source line 71 having a power source potential Vga ("L") with a power source line resistor Rg1 interposed therebetween. Then, the anode terminal of the start diode SD is connected to the second transfer signal line 73 and is connected to the $\varphi^2$ terminal of "H" with the current-limiting resistor R2 interposed therebetween. Accordingly, the start diode SD is forward biased, and the cathode (gate Gt1) of the start diode SD is changed to a value (−1.5V) which is obtained by subtracting a forward electric potential Vd (1.5V) of the pn junction from the electric potential ("H") of the anode of the start diode SD. Further, in a case where the gate Gt1 is changed to −1.5V, the coupling diode D1 is forward biased since the anode (gate Gt1) of the coupling diode D1 is −1.5V and the cathode is connected to the power source line 71 ("L") with the power source line resistor Rg2 interposed therebetween. Accordingly, the electric potential of the gate Gt2 is −3V obtained by subtracting the forward electric potential Vd (1.5V) of the pn junction from the electric potential (−1.5V) of the gate Gt1. Further, the coupling diode D2 is forward biased since the anode (gate Gt1) is −3V and the cathode is connected to the power source line 71 ("L") with the power source line resistor Rg2 interposed therebetween. Accordingly, the electric potential of the gate Gt3 is −4.5V obtained by subtracting the forward electric potential Vd (1.5V) of the pn junction from the electric potential (−3V) of the gate Gt2. However, the gate Gt of which the number is 4 or more is not affected by the fact that the anode of the start diode SD is at "H", and the electric potential of these gate Gt is changed to "L" which is the electric potential of the power source line 71.

It should be noted that since the gate Gt is the gate Gs, the electric potential of the gate Gs is the same as the electric potential of the gate Gt. Accordingly, the threshold voltage of the transfer thyristor T and the setting thyristor S is a value obtained by subtracting the forward electric potential Vd (1.5V) of the pn junction from the electric potentials of the gates Gt and Gs. That is, the threshold voltages of the transfer thyristor T1 and the setting thyristor S1 are −3V, the threshold voltages of the transfer thyristor T2 and the setting thyristor S2 are −4.5V, the threshold voltages of the transfer thyristor T3 and the setting thyristor S3 are −6V, and the threshold voltages of the transfer thyristors T and the setting thyristors S of which the numbers are 4 or more are −6.5 V.

(2) Time b

At the time b shown in FIG. 5, the first transfer signal φ1 transitions from "H" to "L". Thereby, the light emitting device 1 starts an operation.

In a case where the first transfer signal φ1 transitions from "H" to "L", the electric potential of the first transfer signal line 72 transitions from "H" to "L" via the φ1 terminal and the current-limiting resistor R1. Then, since the voltage applied to the transfer thyristor T1 is −3.3V, the transfer thyristor T1 having the threshold voltage of −3V is turned on. In such a case, a current flows through the lower diode UD1. Therefore, the transition from the OFF state to the ON state occurs. By turning on the transfer thyristor T1, the electric potential of the first transfer signal line 72 is changed to an electric potential close to −3.2V (a negative electric potential of which the absolute value is greater than 3.2V), which is obtained by subtracting the forward electric potential Vd (1.5V) of the pn junction from the electric potential (−1.7 V which is the electric potential applied to the lower diode UD1) of the anode of the transfer thyristor T1.

It should be noted that the transfer thyristor T3 has a threshold voltage of −6V, and the transfer thyristor T5 has a threshold voltage of −6.5V. The voltage applied to the transfer thyristor T3 and the transfer thyristor T5 is −1.5V obtained by adding the voltage 1.7V applied to the VCSEL to −3.2V. Therefore, the transfer thyristor T3 and the transfer thyristor T5 are not turned on.

On the other hand, the even-numbered transfer thyristor T cannot be turned on since the second transfer signal φ2 is "H" and the second transfer signal line 73 is at "H".

In a case where the transfer thyristor T1 is turned on, the electric potential of the gate Gt1/Gs1 is changed to "H" which is the electric potential of the anode of the transfer thyristor T1. Then, the electric potential of the gate Gt2 (gate Gs2) is −1.5V, the electric potential of the gate Gt3 (gate Gs3) is −3V, the electric potential of the gate Gt4 (gate Gs4)

is −4.5V, and the electric potential of the gate Gt (the gate Gl) of which the number is 5 or more is changed to "L".

Thereby, the threshold voltages of the setting thyristor S1 are changed to −1.5V, the threshold voltages of the transfer thyristor T2 and the setting thyristor S2 are changed to −3V, the threshold voltages of the transfer thyristor T3 and the setting thyristor S3 are changed to −4.5V, and the threshold voltages of the transfer thyristor T4 and the setting thyristors S4 are changed to −6V, and the threshold voltages of the transfer thyristors T5 and T6 and the setting thyristors S5 and S6 are changed to −6.5V.

However, the first transfer signal line 72 is set to −1.5 V by the transfer thyristor T1 in the ON state. Therefore, the transfer thyristor T having an odd number in the OFF state is not turned on. The second transfer signal line 73 is at "H". Therefore, the even-numbered transfer thyristor T is not turned on. Further, the lighting signal line 75 is at "H". Therefore, none of the VCSELs are lit.

Immediately after the time b (here, in a state in which a thyristor or the like changes due to a change in the electric potential of the signal at the time b and then enters a steady state), the transfer thyristor T1 and the lower diode UD1 are in the ON state, and the other transfer thyristor T, the lower diode UD, the setting thyristor S, and the VCSEL are in the OFF state.

(3) Time c

At the time c, the lighting signal φI transitions from "H" to "L".

In a case where the lighting signal φI transitions from "H" to "L", the lighting signal line 75 transitions from "H" to "L" via the current-limiting resistor RI and the φI terminal. Then, 3.3V, which is the sum of the voltage applied to the VCSEL of 1.7V, is applied to the setting thyristor S1, the setting thyristor S1 having a threshold voltage of −1.5V is turned on, and the VCSEL1 is lit (emits light). Thereby, the electric potential of the lighting signal line 75 is changed to an electric potential close to −3.2V. In addition, the threshold voltage of the setting thyristor S2 is −3V However, the voltage applied to the setting thyristor S2 is −1.5V obtained by adding the voltage of 1.7V applied to the VCSEL to −3.2V. As a result, the setting thyristor S2 is not turned on.

Immediately after the time c, the transfer thyristor T1, the lower diode UD1, and the setting thyristor S1 are in the ON state, and the VCSEL1 is lit (emits light).

(4) Time d

At the time d, the lighting signal φI transitions from "L" to "H".

In a case where the lighting signal φI transitions from "L" to "H", the electric potential of the lighting signal line 75 transitions from −3.2V to "H" via the current-limiting resistor RI and the φI terminal. Then, both the cathode of the setting thyristor S1 and the anode of the VCSEL1 are changed to "H". Therefore, the setting thyristor S1 is turned off and the VCSEL1 is lit off (is turned off). The lighting period of the VCSEL1 is a period, in which the lighting signal φI is "L", from the time c at which the lighting signal φI transitions from "H" to "L" to the time d at which the lighting signal φI transitions from "L" to "H".

Immediately after the time d, the transfer thyristor T1 is in the ON state.

(5) Time e

At the time e, the second transfer signal φ2 transitions from "H" to "L". Here, the period T(1) for controlling lighting of the VCSEL1 ends, and the period T(2) for controlling lighting of the VCSEL2 starts.

In a case where the second transfer signal φ2 transitions from "H" to "L", the electric potential of the second transfer signal line 73 transitions from "H" to "L" via the φ2 terminal. As described above, the transfer thyristor T2 is turned on since the threshold voltage is changed to −3V. In such a case, a current also flows through the lower diode UD2. Therefore, the transition from the OFF state to the ON state occurs.

Thereby, the electric potential of the gate terminal Gt2 (gate terminal Gs2) is changed to "H" (0V), the electric potential of the gate Gt3 (gate Gs3) is changed to −1.5V, the electric potential of the gate Gt4 (gate Gs4) is changed to −3V, the electric potential of the gate Gt5 (gate Gs5) is changed to −4.5V, and the electric potential of the gate Gt6 (gate Gs6) is changed to −5V. Immediately after the time e, the transfer thyristors T1 and T2 and the lower diodes UD1 and UD2 are in the ON state.

(6) Time f

At the time f, the first transfer signal φ1 transitions from "L" to "H".

In a case where the first transfer signal φ1 transitions from "L" to "H", the electric potential of the first transfer signal line 72 transitions from "L" to "H" via the φ1 terminal. Then, both the anode and the cathode of the transfer thyristor T1 are changed to "H", such that the transfer thyristor T1 in the ON state is turned off. In such a case, both the anode and the cathode of the lower diode UD1 are also changed to "H", such that the transition from the ON state to the OFF state occurs.

Then, the electric potential of the gate Gt1 (gate Gs1) changes toward the power source potential Vga ("L") of the power source line 71 via the power source line resistor Rg1. Thereby, the coupling diode D1 is in a state in which an electric potential is applied in a direction in which a current does not flow (reverse bias). Accordingly, the gate Gt1 (gate Gs1) does not have the effect that the gate Gt2 (gate Gs2) is "H". That is, the threshold voltage of the transfer thyristor T having the gate Gt connected by the reverse bias coupling diode D is changed to −6.5 V, and the transfer thyristor T is not turned on even in a case where the first transfer signal φ1 or the second transfer signal φ2 is changed to "L".

Immediately after the time f, the transfer thyristor T2 and the lower diode UD2 are in the ON state.

(7) Others

At the time g, in a case where the lighting signal φI transitions from "H" to "L", the setting thyristor S2 is turned on and the VCSEL2 is lit (emits light) in the same manner as the VCSEL1 and the setting thyristor S1 at the time c.

Then, in a case where the lighting signal φI transitions from "L" to "H" at the time h, the setting thyristor S2 is turned off in the same manner as the VCSEL1 and the setting thyristor S1 at the time d, and the VCSEL2 is lit off.

Further, in a case where the first transfer signal (pi transitions from "H" to "L" at the time i, the transfer thyristor T3 having a threshold voltage of −3V is turned on in the same manner as the transfer thyristor T1 at the time b or the transfer thyristor T2 at the time e. At the time point i, the period T(2) for controlling the lighting of the VCSEL 2 ends, and the period T(3) for controlling the lighting of the VCSEL 3 starts.

Thereafter, the above-mentioned steps will be repeated.

In a case where the VCSELs are not turned on (do not emit light) but remain lit off (non-lit), similarly to the lighting signal φI shown in a range from the time j to the time k in the period T(4) for controlling the lighting of the VCSEL 4 in FIG. 5, the lighting signal φI may remain at "H". By doing so, even in a case where the threshold voltage of the setting thyristor S4 is −1.5V, the setting thyristor S4 is not turned on and the VCSEL remains lit off (non-lit).

As described above, the gate terminals Gt of the transfer thyristors T are connected to each other through the coupling diode D. Accordingly, in a case where the electric potential of the gate Gt changes, the electric potential of the gate Gs connected to the gate Gt of which the electric potential is changed via the forward bias coupling diode D changes. Then, the threshold voltage of the transfer thyristor T having the gate from which the electric potential is changed changes. In a case where the threshold voltage of the transfer thyristor T is higher than −3.3V (a negative value with a small absolute value), the transfer thyristor T is turned on at a timing at which the first transfer signal φ1 or the second transfer signal φ2 transitions from "H" to "L".

Then, the threshold voltage of the setting thyristor S in which the gate Gs is connected to the gate Gt of the transfer thyristor T in the ON state has a threshold voltage of −1.5V Therefore, in a case where the lighting signal φI transitions from "H" to "L", the transfer thyristor T is turned on, and the VCSEL connected in series to the setting thyristor S is turned on (emits light).

That is, the transfer thyristor T is turned on to specify the VCSEL to be subjected to the lighting control, and the lighting signal φI of "L" turns on the setting thyristor S, which is connected in series to the VCSEL to be subjected to the lighting control, and lights the VCSEL. That is, in the light emitting chip 10, the VCSELs are sequentially turned on by transferring the ON state of the transfer thyristors T.

It should be noted that the lighting signal φI of "H" maintains the setting thyristor S in the OFF state and maintains VCSEL not lit. That is, the lighting signal φI sets the lighting/non-lighting of the VCSEL.

It should be noted that the voltage described above is an example and may be changed in accordance with the emission wavelength and the amount of light of the VCSEL. In such a case, the electric potential ("L") of the lighting signal (φI may be adjusted.

As described above, in the light emitting device 1 of the present exemplary embodiment, there are a plurality of elements (transfer thyristors T1 to T128, setting thyristors S1 to S128, VCSEL1 to VCSEL128, and the like). Thus, among the plurality of elements, elements to be in the ON state are sequentially turned on. Accordingly, in the light emitting device 1, the plurality of setting thyristors S are individually turned on through the lighting control performed by the light emission control unit 110. Then, in a case where each of the setting thyristors S is turned on, the VCSELs corresponding to the setting thyristors S individually emit light.

Further, in a measurement apparatus 1000, the system control unit 30 controls an output of the signal in the light emission control unit 110 to emit light for measurement.

Manufacturing of Light Emitting Chip 10

Subsequently, manufacturing of the light emitting chip 10 according to the first exemplary embodiment will be described.

The steps of manufacturing the light emitting chip 10 can be generally divided into: (1) a step of laminating a semiconductor layer on a substrate to manufacture a semiconductor-laminated substrate (hereinafter, referred to as "(1) manufacturing step of a semiconductor-laminated substrate"); and (2) a step of processing a semiconductor-laminated substrate into a light emitting chip (hereinafter, referred to as "(2) a processing step of a light emitting chip").

First, (1) the manufacturing step of the semiconductor-laminated substrate will be described with reference to FIG. 6. Since a semiconductor-laminated substrate 100 described below has the same semiconductor layers as the island 301 of the light emitting chip 10 described with reference to FIG. 4, the names and reference numerals of the respective layers are the same as the names and reference numerals in FIG. 4. Further, the same names and reference numerals as the names and reference numerals in FIG. 4 are used for the semiconductor laminate and the laminated structure.

Figure 6A:
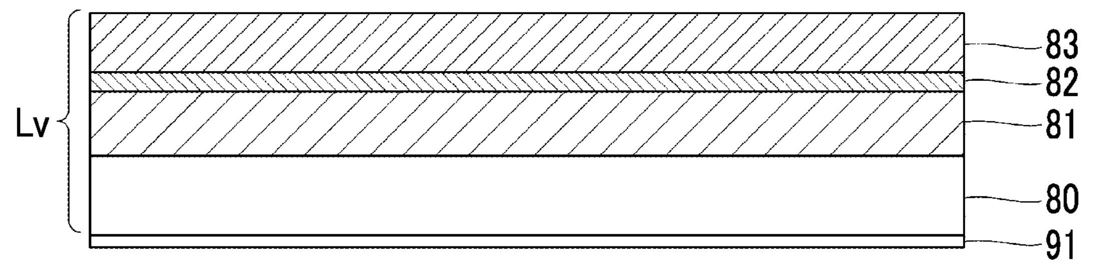
FIGS. 6A to 6C are diagrams each showing a manufacturing step of a semiconductor-laminated substrate according to the first exemplary embodiment.
Figure 6B:
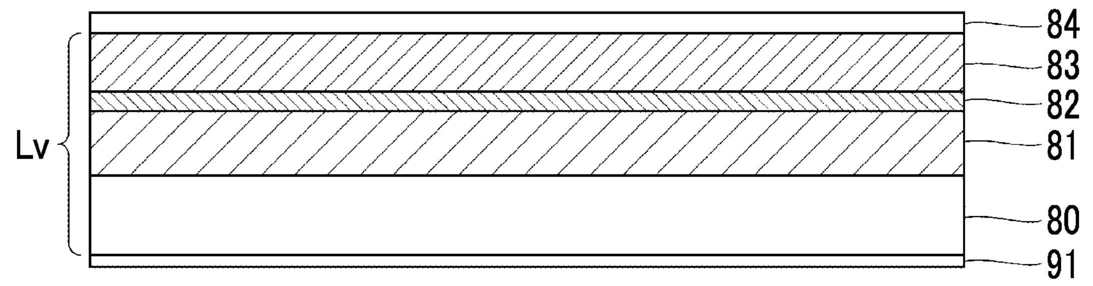
Figure 6C:
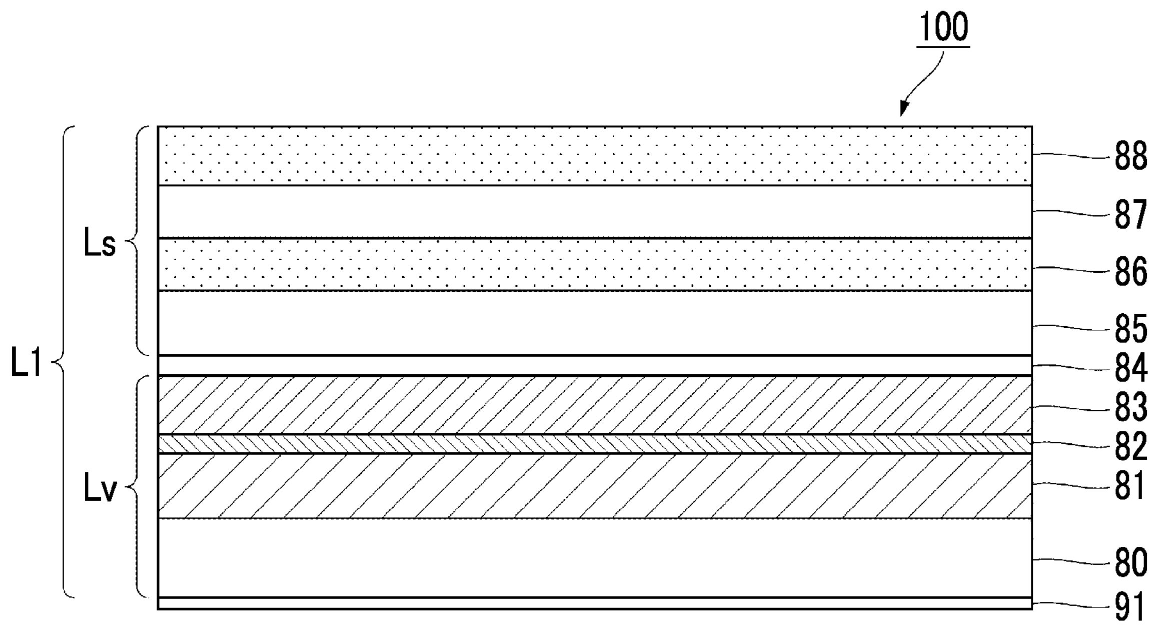

FIGS. 6A to 6C are diagrams each showing a manufacturing step of the semiconductor-laminated substrate 100 according to the first exemplary embodiment. FIG. 6A shows a step of forming the semiconductor laminate Lv processed into the VCSEL, FIG. 6B shows a step of forming the tunnel junction layer 84, and FIG. 6C shows a step of forming the semiconductor laminate Ls processed into the thyristor.

(1-1) Step of Forming Semiconductor Laminate Lv

First, as shown in FIG. 6A, the p-anode (DBR) layer 81, the light emission layer 82, and the n-cathode (DBR) layer 83 are epitaxially grown in this order on the p-type substrate 80 to form the semiconductor laminate Lv. The semiconductor layers each are laminated by, for example, a metal organic chemical vapor deposition (MOCVD) method, a molecular beam epitaxy (MBE) method, or the like.

The semiconductor laminate Lv is a semiconductor laminate processed into the VCSEL of the light emitting chip 10, and is an example of the first semiconductor laminate processed into the light emitting element. Further, (1-1) the step of forming the semiconductor laminate Lv is an example of a first laminate formation step of forming the first semiconductor laminate on the substrate.

In the exemplary embodiment of the present invention, the substrate 80 will be described using p-type GaAs as an example, but may be n-type GaAs or an intrinsic (i) GaAs to which no impurity is added. Further, a semiconductor substrate made of InP, GaN, InAs, other group III-V or II-VI materials, sapphire, Si, Ge, or the like may be used. In a case where the substrate is changed, a material that substantially matches the lattice constants of the substrate (including a strain structure, a strain relaxation layer, and metamorphic growth) is used as a material to be monolithically laminated on the substrate. For example, InAs, InAsSb, GaInAsSb, and the like are used on the InAs substrate, InP, InGaAsP, and the like are used on the InP substrate, and GaN, AlGaN, and InGaN are used on the GaN substrate or the sapphire substrate, and Si, SiGe, GaP, and the like are used on the Si substrate. However, in a case where the semiconductor material is attached to another support substrate after crystal growth, it is not necessary that the semiconductor materials are substantially lattice-matched with the support substrate.

The p-anode (DBR) layer 81 is formed by laminating the plurality of semiconductor layers having refractive index differences. More specifically, the p-anode (DBR) layer 81 is formed by alternately laminating a high refractive index layer having a relatively high refractive index and a low refractive index layer having a relatively low refractive index. It should be noted that the phrase "the high refractive index layer has a relatively high refractive index" means that the refractive index is higher than the refractive index of the low refractive index layer. In a similar manner, the phrase "the low refractive index layer has a relatively low refractive index" means that the refractive index is lower than the refractive index of the high refractive index layer. Further, in a similar manner to the p-anode (DBR) layer 81, the n-cathode (DBR) layer 83 is formed such that a high refractive index layer that has a relatively high refractive index and a low refractive index layer that has a relatively low refractive index are alternately laminated.

The p-anode (DBR) layer 81 and the n-cathode (DBR) layer 83 are formed in combination of, for example, a high refractive index layer having a low Al composition of $Al_{0.2}Ga_{0.8}As$ and a low refractive index layer having a high Al composition of $Al_{0.9}Ga_{0.1}As$.

As described above, the light emission layer 82 has a quantum well structure in which well layers and barrier layers are alternately laminated. The well layer is formed of, for example, GaAs, AlGaAs, InGaAs, GaAsP, AlGaInP, GaInAsP, GaInP, or the like. Further, the barrier layer is formed of, for example, AlGaAs, GaAs, GaInP, GaInAsP, or the like.

(1-2) Step of Forming Tunnel Junction Layer 84

Next, as shown in FIG. 6B, the tunnel junction layer 84 is formed on the semiconductor laminate Lv. More specifically, the tunnel junction layer 84 in the first exemplary embodiment is formed through epitaxial growth on the n-cathode (DBR) layer 83, which is the uppermost layer among the semiconductor layers constituting the semiconductor laminate Lv.

The tunnel junction layer 84 is configured by cementing an $n^{++}$ layer in which n-type impurities are added at a high concentration and a $p^{++}$ layer in which n-type impurities are added at a high concentration. The $n^{++}$ layer 84*a* and the $p^{++}$ layer have, for example, an impurity concentration of $1\times10^{20}/cm^3$, which is a high concentration with respect to an impurity concentration of $10^{17}/cm^3$ to $10^{18}/cm^3$ for normal cementing. Examples of the combination of the $n^{++}$ layer and the $p^{++}$ layer (hereinafter, referred to as $n^{++}$ layer/$p^{++}$ layer) include, for example, $n^{++}$ GaInP/$p^{++}$ GaAs, $n^{++}$ GaInP/$p^{++}$ AlGaAs, $n^{++}$ GaAs/$p^{++}$ GaAs, $n^{++}$ AlGaAs/$p^{++}$ AlGaAs, $n^{++}$ InGaAs/$p^{++}$ InGaAs, $n^{++}$ GaInAsP/$p^{++}$ GaInAsP, and $n^{++}$ GaAsSb/$p^{++}$ GaAsSb. It should be noted that the combinations may be changed from each other.

(1-3) Step of Forming Semiconductor Laminate Ls

Next, as shown in FIG. 6C, the p-anode layer 85, the n-gate layer 86, the p-gate layer 87, and the n-cathode layer 88 are epitaxially grown on the tunnel junction layer 84 in this order to form a semiconductor laminate Ls.

The semiconductor laminate Ls is a semiconductor laminate processed into the setting thyristor S of the light emitting chip 10, and is an example of the second semiconductor laminate processed into the thyristor. Further, (1-3) the step of forming the semiconductor laminate Ls is an example of a second laminate formation step of forming the second semiconductor laminate on the substrate.

The p-anode layer 85 is formed of, for example, p-type $Al_{0.9}GaAs$ having an impurity concentration of $1\times10^{18}/cm^3$. The n-gate layer 86 is, for example, n-type $Al_{0.9}GaAs$ having an impurity concentration of $1\times10^{17}/cm^3$. Further, the p-gate layer 87 is, for example, p-type $Al_{0.9}GaAs$ having an impurity concentration of $1\times10^{17}/cm^3$. The n-cathode layer 88 is, for example, n-type $Al_{0.9}GaAs$ having an impurity concentration of $1\times10^{18}/cm^3$.

It should be noted that the Al composition of the p-anode layer 85, the n-gate layer 86, the p-gate layer 87, and the n-cathode layer 88 may be changed in a range of 0 to 1. Further, instead of $Al_{0.9}GaAs$, another composition such as GaInP may be applied.

Through the above-mentioned steps of (1-1) the step of forming the semiconductor laminate Lv, (1-2) the step of forming the tunnel junction layer 84, and (1-3) the step of forming the semiconductor laminate Ls described above, the laminated structure L1 including the semiconductor laminate Lv, the tunnel junction layer 84 is formed on the substrate 80, and the semiconductor-laminated substrate 100 is manufactured.

Adjustment of Laminated Structure L1

Meanwhile, in evaluating the quality of the product including the light emitting element, a resonant wavelength of the light emitting element grasped from the reflection profile of the product is used. For example, the resonant wavelength of the VCSEL is used for evaluating quality of the semiconductor-laminated substrate including the semiconductor laminate processed into the VCSEL. However, in a case where the light emitting element and the thyristor used for driving the light emitting element are laminated on the same substrate, a reflection profile of the product includes not only a resonance of the light emitting element but also the information of the resonance due to the effect of the thyristor. In such a product, in a case where the resonance of the light emitting element and the resonance due to the effect of the thyristor have the same resonant wavelength, it is difficult to grasp the resonant wavelength of the light emitting element from the reflection profile.

Therefore, in the semiconductor-laminated substrate 100, the laminated structure L1 is adjusted such that the two resonant wavelengths $\lambda s\mathbf{1}$ and $\lambda s\mathbf{2}$ due to the effect of the setting thyristor S are located on both sides of the resonant wavelength $\lambda v$ of the VCSEL. More specifically, in the semiconductor-laminated substrate 100 according to the first exemplary embodiment, the laminated structure L1 is adjusted by adjusting the thickness of the semiconductor layer formed in (1-3) the step of forming the semiconductor laminate Ls.

It should be noted that the phrase "two resonant wavelengths $\lambda s\mathbf{1}$ and $\lambda s\mathbf{2}$ are located on both sides of the resonant wavelength $\lambda v$ of the VCSEL" means that, regarding two resonant wavelengths $\lambda s\mathbf{1}$ and $\lambda s\mathbf{2}$, one resonant wavelength $\lambda s\mathbf{1}$ is smaller than the resonant wavelength $\lambda v$ (which is a short wavelength) and the other resonant wavelength $\lambda s\mathbf{2}$ is greater than the resonant wavelength $\lambda v$ (which is a long wavelength).

Here, an example of a procedure for adjusting the laminated structure L1 will be described using a reflectance spectrum as an example of the reflection profile.

Figure 7A:
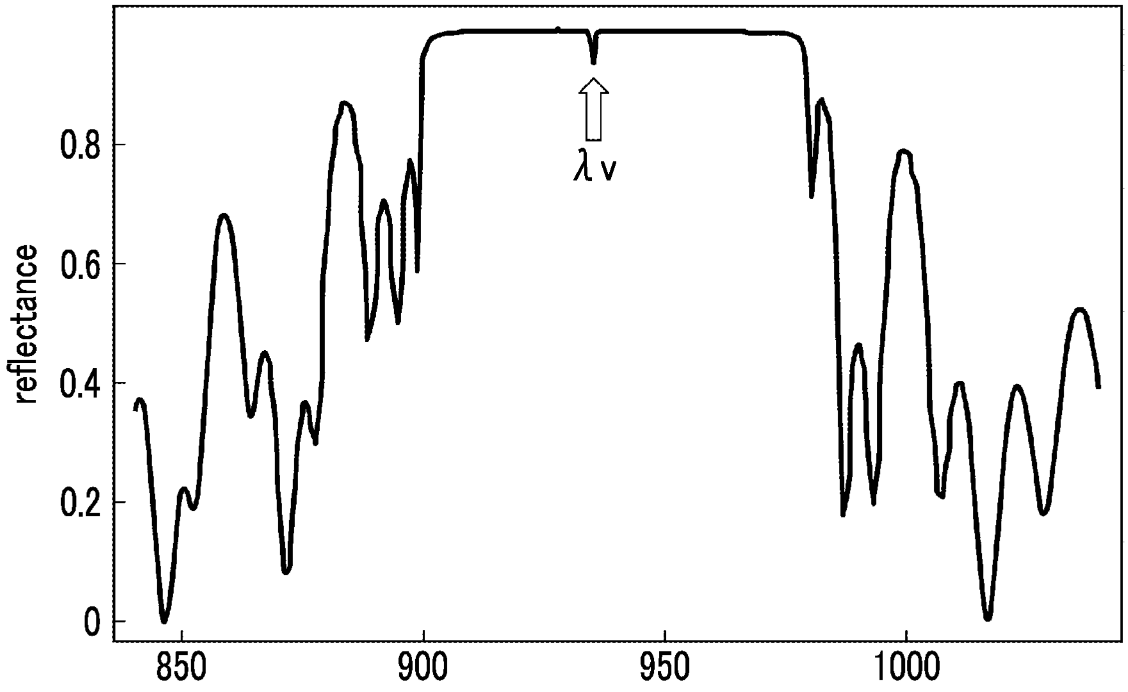
FIGS. 7A and 7B are diagrams each corresponding to a reflectance spectrum.
Figure 7B:
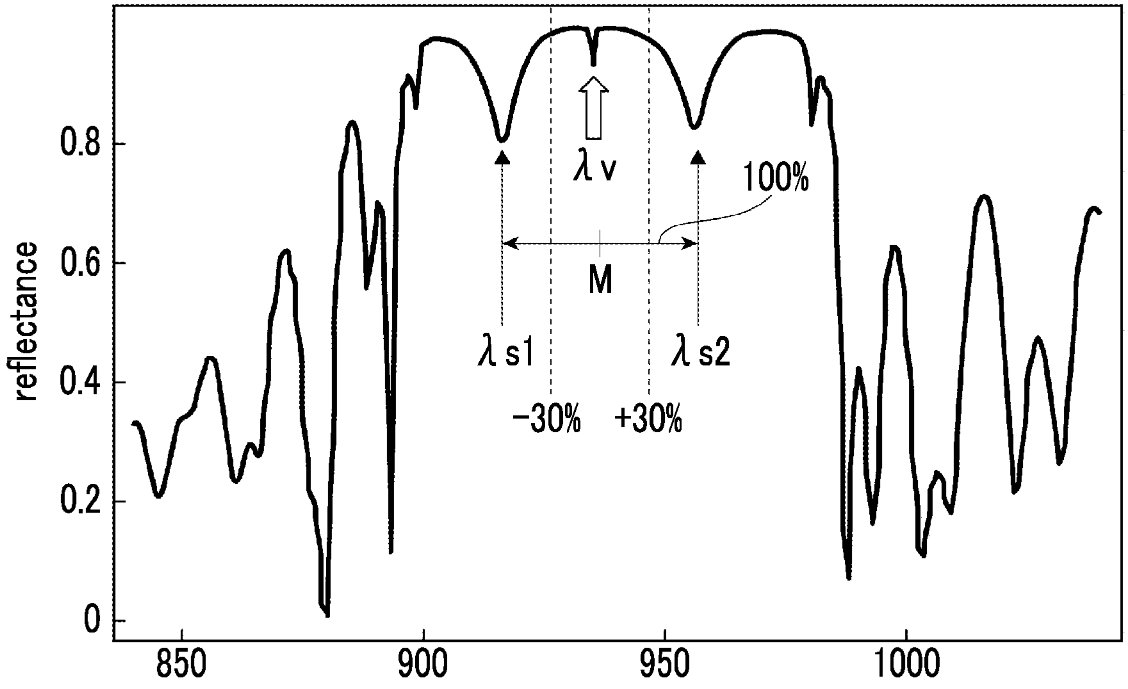

FIGS. 7A and 7B are diagrams each corresponding to the reflectance spectrum. FIG. 7A shows a reflectance spectrum in a case where only the semiconductor laminate Lv is formed on the substrate 80, and FIG. 7B shows a reflectance spectrum in a case where the laminated structure L1 is formed. That is, FIG. 7B corresponds to the reflectance spectrum of the semiconductor-laminated substrate. It should be noted that, in FIGS. 7A and 7B, the horizontal axis represents the wavelength [nm] and the vertical axis represents the reflectance [–].

Figure 8:
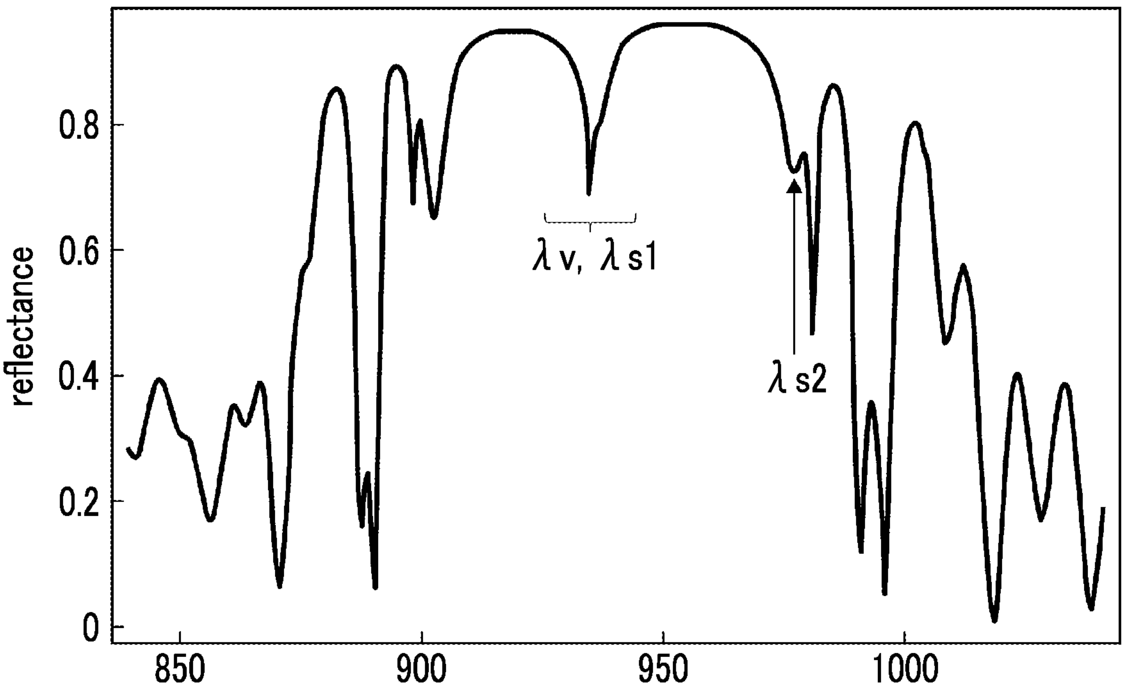
FIG. 8 is a diagram showing a reflectance spectrum in a semiconductor-laminated substrate of a comparative example.

FIG. 8 is a diagram showing a reflectance spectrum in a semiconductor-laminated substrate 100 of a comparative example. It should be noted that the semiconductor-laminated substrate 100' of the comparative example is the same as the semiconductor-laminated substrate 100 except that the laminated structure L1 is not adjusted.

First, after (1-1) the step of forming the semiconductor laminate Lv, the reflectance spectrum in a case where only the semiconductor laminate Lv is formed on the substrate 80 is measured. The measurement may be performed by using, for example, a known reflectance measurement apparatus, and is performed by irradiating the semiconductor laminate Lv with light from a side opposite to the substrate 80 (the side on which the n-cathode (DBR) layer 83 is formed) and measuring the light returned by reflection.

Thereby, for example, the reflectance spectrum shown in FIG. 7A is obtained. Then, in the reflectance spectrum shown in FIG. 7A, the semiconductor laminate Lv, that is, the resonant wavelength λv corresponding to VCSEL is observed. As indicated by the white arrow, the resonance of the VCSEL is observed as a depression (valley) in reflectance and has a width, but the wavelength of a part (valley bottom), in which the depression in reflectance is the largest, is specified as the resonant wavelength λv. The same applies to the resonant wavelengths λs1 and λs2 due to the effect of the setting thyristor S to be described later.

Next, after (1-3) the step of forming the semiconductor laminate Ls, the reflectance spectrum of the obtained semiconductor-laminated substrate is measured. In the measured reflectance spectrum, as shown in FIG. 7B, the two resonant wavelengths λs1 and λs2 are newly observed due to the effect of the setting thyristor S.

In the first exemplary embodiment, the laminated structure L1 is adjusted such that the resonant wavelengths λs1 and λs2 are located on both sides of the resonant wavelength λv of the VCSEL. More specifically, as shown in FIG. 7B, production of a sample of the semiconductor-laminated substrate, in which the thicknesses t(85) and t(88) of the formed p-anode layer 85 and the formed n-cathode layer 88 are changed, and measurement of the reflectance spectrum are repeated until the reflectance spectrum is obtained such that the resonant wavelengths λs1 and λs2 are located on both sides of the resonant wavelength λv.

Then, in a case where the reflectance spectrum is obtained such that the resonant wavelengths λs1 and λs2 are located on both sides of the resonant wavelengths λv, the thicknesses t(85) and t(88) of the sample are determined as the thicknesses of the p-anode layer 85 and the n-cathode layer 88 in the final semiconductor-laminated substrate 100. Hereinafter, in the manufacturing step of the semiconductor-laminated substrate 100, the p-anode layer 85 and the n-cathode layer 88 are formed with the thicknesses.

In such a manner, the laminated structure L1 according to the first exemplary embodiment is adjusted. In the reflectance spectrum of the semiconductor-laminated substrate 100 manufactured in such a manufacturing step, the resonant wavelengths λs1 and λs2 are located on both sides of the resonant wavelength λv, as in FIG. 7B. Consequently, in evaluation or the like of the manufactured semiconductor-laminated substrate 100, it is easier to grasp the resonant wavelength λv of the VCSEL than in a case where any one of the resonant wavelengths λs1 and λs2 is equal to the resonant wavelength λv.

In the semiconductor-laminated substrate 100 according to the first exemplary embodiment, the laminated structure L1 is adjusted by adjusting the thickness of at least one of the p-anode layer 85 or the n-cathode layer 88. In general, in the thyristor, change in the thickness of the gate layer has greater effect on the characteristics of the thyristor than in a case where the thickness of the anode layer or the cathode layer is changed. Consequently, in the semiconductor-laminated substrate 100, as compared with a case where only the n-gate layer 86 and the p-gate layer 87 are changed, the effect on the characteristics of the setting thyristor S is suppressed, by adjusting the thickness of at least one of the p-anode layer 85 or the n-cathode layer 88.

In another exemplary embodiment, the thicknesses of the n-gate layer 86 and the p-gate layer 87 may be changed, and the thicknesses of the p-anode layer 85 and the n-cathode layer 88 may not be changed.

In addition, as described with reference to FIG. 4, in the light emitting chip 10 according to the first exemplary embodiment, the p-anode layer 85 and the n-cathode layer 88 are thicker than the n-gate layer 86 and the p-gate layer 87. That is, in the semiconductor-laminated substrate 100, the laminated structure L1 is adjusted by making the p-anode layer 85 and the n-cathode layer 88 thicker than the n-gate layer 86 and the p-gate layer 87. In such a manner, as compared with a case where the n-gate layer 86 and the p-gate layer 87 are thicker than the p-anode layer 85 and the n-cathode layer 88, the effect on the characteristics of the setting thyristor S is suppressed by increasing the range of adjustment by the p-anode layer 85 and the n-cathode layer 88.

Further, as shown in FIG. 7B, assuming that a distance between the two resonant wavelengths λs1 and λs2 due to the effect of the setting thyristor S is 100%, the adjustment of the laminated structure L1 in the first exemplary embodiment is performed such that the resonant wavelength λv of the VCSEL is located within a range of ±30% from an average M of the resonant wavelengths λs1 and λs2. Thereby, as compared with the case where the resonant wavelength λv is located outside the range, the resonant wavelength λv of the VCSEL is easily grasped by suppressing overlapping between depression in reflectance (valley) corresponding to the resonance of the setting thyristor S and depression in reflectance (valley) corresponding to the resonance of the VCSEL.

Here, in the semiconductor-laminated substrate 100' (not shown in the drawing) of the comparative example in which the laminated structure is not adjusted, either one of the resonant wavelengths λs1 and λs2 due to the effect of the setting thyristor S may be the same as the resonant wavelength λv of the VCSEL. In such a case, as shown in FIG. 8, in the reflectance spectrum, the depression (valley) of the reflectance corresponding to the resonance of the setting thyristor S and the depression (valley) of the reflectance corresponding to the resonance of the VCSEL overlap each other. Thus, it is difficult to grasp the resonant wavelength λv of the VCSEL from the reflectance spectrum.

In addition, in a case where either one of the resonant wavelengths λs1 and λs2 and the resonant wavelength λv of the VCSEL are the same wavelength in the semiconductor-laminated substrate 100', the reflectance at the wavelength λv is greatly reduced. As a result, it is difficult to ensure reflectance necessary for laser oscillation of the VCSEL. On the other hand, in the semiconductor-laminated substrate 100 according to the exemplary embodiment of the present invention, reduction in reflectance at the wavelength λv is suppressed, and the reflectance necessary for laser oscillation is ensured.

In the above description, a procedure of actually measuring the reflectance spectra of the semiconductor laminate Lv and the sample of the semiconductor-laminated substrate and adjusting the laminated structure L1 will be described as an example. Instead of actually measuring the reflectance, the reflection profile for each wavelength may be calculated by using a calculation method such as the characteristic matrix method with the thickness of the formed semiconductor layer as a parameter. On the basis of the calculation result, the laminated structure L1 may be adjusted.

The step of manufacturing the semiconductor-laminated substrate (1) described above includes: a first laminate formation step (1-1) of forming the semiconductor laminate Lv to be processed into the VCSEL on the substrate 80; and a second laminate formation step (1-3) of forming the semiconductor laminate Ls to be processed into the setting thyristor S on the semiconductor laminate Lv. The second laminate formation step (1-3) may be considered as a manufacturing method of the semiconductor-laminated substrate 100, which is characterized by forming the semiconductor layers 85 to 88 of which the thicknesses are determined such that the two resonant wavelengths λs1 and λs2 due to the effect of the setting thyristor S are located on both sides of the resonant wavelength λv of the VCSEL.

Next, (2) a processing step of forming the light emitting chip will be described with reference to FIGS. 9A to 10F.

Figure 9A:
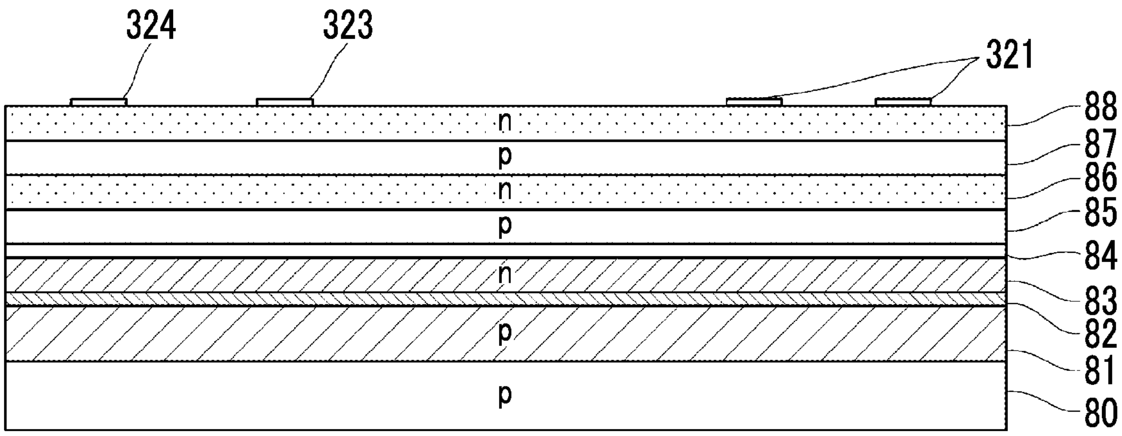
FIGS. 9A to 9C are diagrams each showing a processing step from the semiconductor-laminated substrate to the light emitting chip.
Figure 9B:
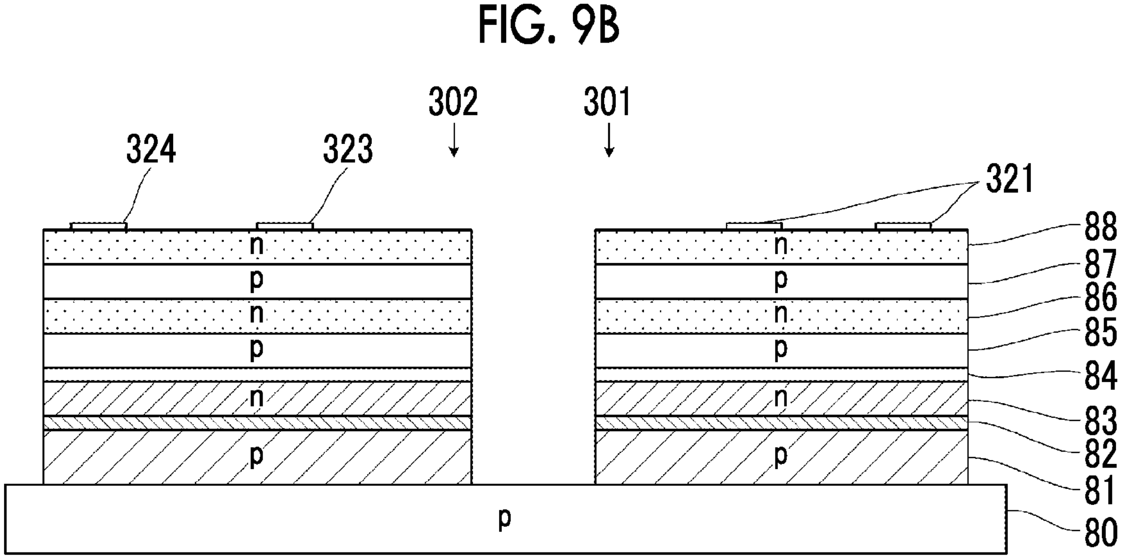
Figure 9C:
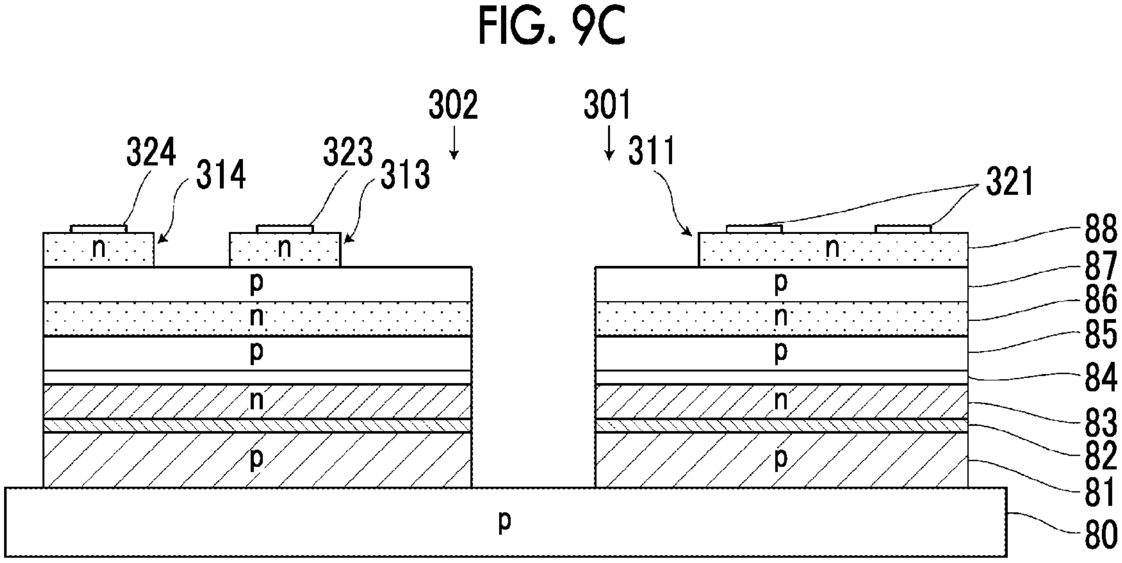
Figure 10D:
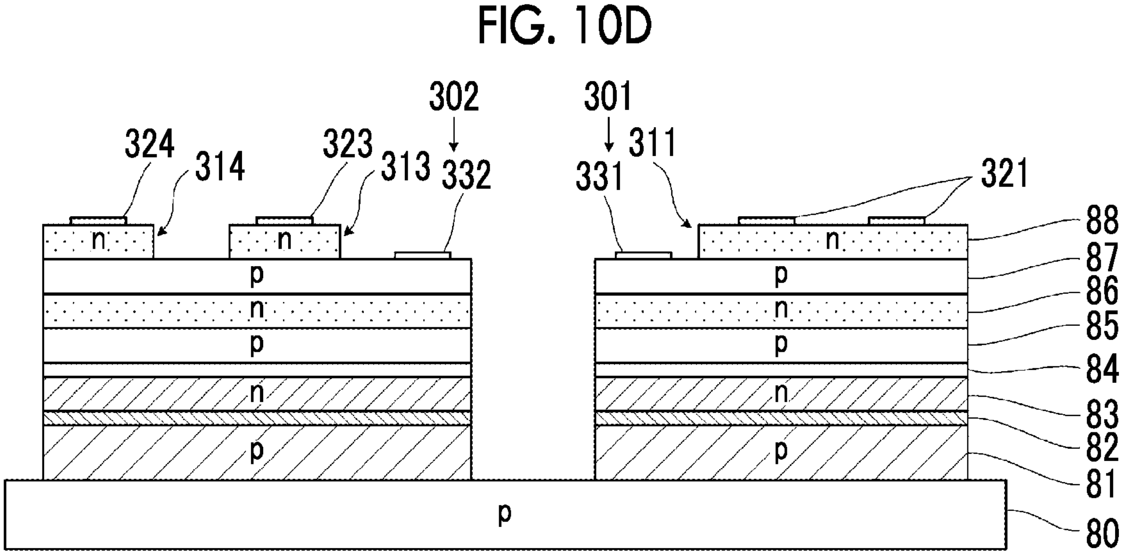
FIGS. 10D to 10F are diagrams each showing a processing step from the semiconductor-laminated substrate to the light emitting chip.
Figure 10E:
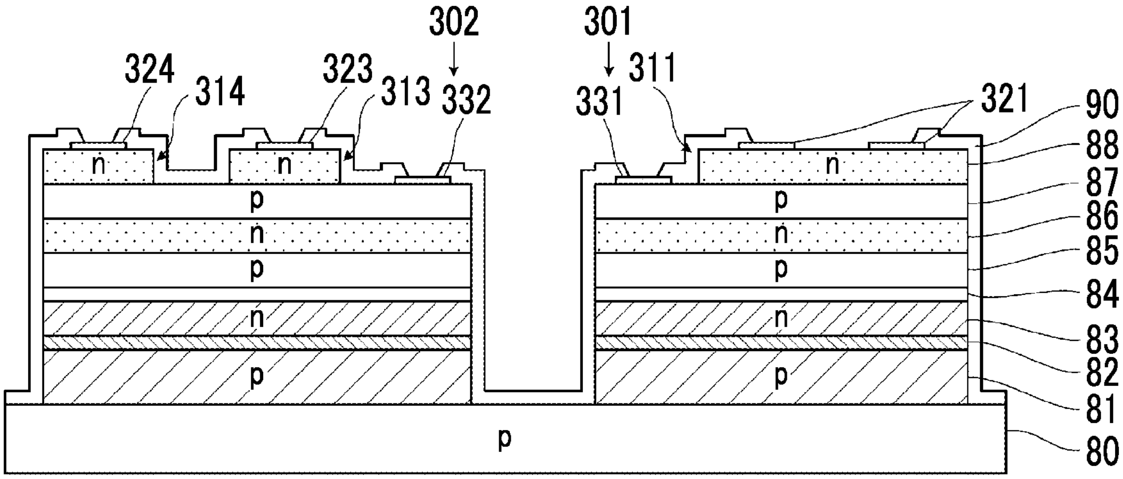
Figure 10F:
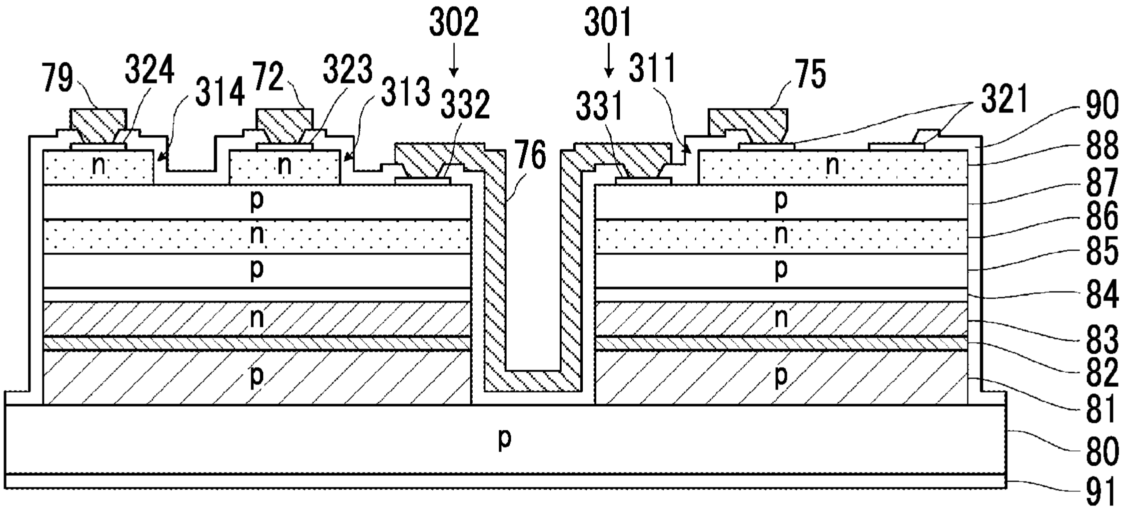

FIGS. 9A to 10F are diagrams each showing a processing step from the semiconductor-laminated substrate 100 to the light emitting chip 10. FIG. 9A shows a step of forming the n-ohmic electrodes 321, 323, 324, and the like, FIG. 9B shows a step of separating the n-ohmic electrodes into the islands 301 and 302, and FIG. 9C shows a step of exposing the p-gate layer 87. Further, FIG. 10D is a step of forming the p-ohmic electrodes 331 and 332, FIG. 10E is a step of forming the protective layer 90, and FIG. 10F is a step of forming various wirings (such as the power source line 71, the first transfer signal line 72, the second transfer signal line 73, and the lighting signal line 75) and the rear surface electrode 91.

(2-1) Step of Forming n-Ohmic Electrodes 321, 323, 324, and the Like First, as shown in FIG. 9A, n-ohmic electrodes 321, 323, 324, and the like are formed on the n-cathode layer 88 formed on the top of the semiconductor-laminated substrate 100. The n-ohmic electrodes 321, 323, and 324 are Au (AuGe) containing Ge, which can easily make ohmic contact with the n-type semiconductor layer such as the n-cathode layer 88.

The n-ohmic electrodes 321, 323, 324, and the like are formed by, for example, a lift-off method.

(2-2) Step of Separating into Islands 301 and 302

Next, as shown in FIG. 9B, the n-cathode layer 88, the p-gate layer 87, the n-gate layer 86, the p-anode layer 85, the tunnel junction layer 84, the n-cathode (DBR) layer 83, the light emission layer 82, and the p-anode (DBR) layer 81 are sequentially etched and separated into islands such as the islands 301 and 302. In other words, the laminated structure L1, which is formed on the substrate 80, is separated into each island.

The etching may be performed as wet etching using a sulfuric acid-based etching solution (sulfuric acid:hydrogen peroxide solution:water=1:10:300 in weight ratio) or the like, and may be performed as anisotropic dry etching (RIE) using boron chloride or the like. Etching in the step may be referred to as mesa etching or post etching.

In a case where the current constriction layer is provided in the p-anode (DBR) layer 81, for example, after (2-2) the step of separating into islands 301 and 302, the semiconductor layer may be oxidized from a side surface (side surface exposed by etching), and the current blocking portion may be formed. The oxidation is performed by oxidizing Al by water vapor oxidation at 300 to 400° C. In such a case, the oxidation proceeds from the exposed side surface, the current blocking portion made of Al2O3 which is an oxide of Al is formed around the islands such as the islands 301 and 302, and the unoxidized portion is formed as the current passage portion.

(2-3) Step of Exposing P-Gate Layer 87

Next, as shown in FIG. 9C, the p-gate layer 87 is exposed by etching a part of the n-cathode layer 88. Thereby, in the island 301, a region 311 in which the p-gate layer 87 is exposed is provided. Further, in the island 302, regions 313 and 314 in which the p-gate layer 87 is exposed are provided.

It should be noted that the etching may be a wet etching using a sulfuric acid-based etching solution (sulfuric acid: hydrogen peroxide solution:water=1:10:300 in weight ratio) in the same manner as in (2-2) the step of separating the islands 301 and 302, and by the anisotropic dry etching using boron chloride, or the like.

(2-4) Step of Forming p-Ohmic Electrodes 331, 332, and The Like

Next, as shown in FIG. 10D, p-ohmic electrodes 331, 332, and the like are formed on the exposed p-gate layer 87. In the example of FIG. 10D, the p-ohmic electrode 331 is formed in the region 311 in which the p-gate layer 87 is exposed. Further, the p-ohmic electrode 332 is formed in the region 313 in which the p-gate layer 87 is exposed. The p-ohmic electrodes 331 and 332 are, for example, Au (AuZn) or the like containing Zn that is able to easily make ohmic contact with a p-type semiconductor layer such as the p-gate layer 87, and are formed by a lift-off method or the like.

(2-5) Step of Forming Protective Layer 90

Next, as shown in FIG. 10E, the protective layer 90 is formed so as to cover the front surfaces of the islands 301, 302, and the like. In such a case, the light emitting port 90A (refer to FIG. 3B) and the through-hole (refer to FIG. 3A) of the light emitting chip 10 are formed together. The protective layer 90 is made of, for example, an insulating material such as $SiO_2$, SiON, or SiN.

(2-6) Step of Forming Various Wirings and Rear Surface Electrode 91

Finally, as shown in FIG. 10F, various wirings (such as the power source line 71, the first transfer signal line 72, the second transfer signal line 73, and the lighting signal line 75) and the rear surface electrode 91 are formed. In the step, wirings for connecting the n-ohmic electrodes 321, 323, and 324 and the p-ohmic electrodes 331 and 332 are formed via the through-holes provided in the protective layer 90. The wirings are made of, for example, a metal material such as Al or Au.

As described above, in the exemplary embodiment of the present invention, the semiconductor-laminated substrate 100 having the laminated structure L1 is processed into the light emitting chip 10 through the steps (2-1) to (2-6).

As described above, the laminated structure L1 is adjusted such that two resonant wavelengths λs1 and λs2 due to the effect of the setting thyristor S are located on both sides of the resonant wavelength λv of the VCSEL (refer to FIG. 7). Consequently, the light emitting chip 10 according to the first exemplary embodiment is an example of the light emitting component of which the laminated structure is adjusted such that two resonant wavelengths due to the effect of the thyristor are located on both sides of the resonant wavelength of the light emitting element. Further, the light emitting device 1 and the measurement apparatus 1000 using the light emitting chip 10 are respectively examples of the light emitting device and the measurement apparatus in which the laminated structure is adjusted such that two resonant wavelengths due to the effect of the thyristor are located on both sides of the resonant wavelength of the light emitting element.

In a case where the light emitting chip 10, the light emitting device 1, or the measurement apparatus 1000 as a product is evaluated, for example, the thickness of the semiconductor layer constituting the island 301 of the light emitting chip 10 is measured by a transmission electron microscope (TEM) or the like. On the basis of the thickness of each layer, the calculation therefor using the characteristic matrix method may be performed. The reflection profile as the calculation result includes not only the resonance of the VCSEL but also the information of the resonance due to the effect of the setting thyristor S. However, since the laminated structure L1 is adjusted as described above, the resonant wavelength λv of the VCSEL may be easily grasped.

As described above, according to the method of manufacturing the semiconductor-laminated substrate 100, the light emitting chip 10, the light emitting device 1, the measurement apparatus 1000, and the semiconductor-laminated substrate 100 according to the first exemplary embodiment, it is easy to grasp the resonant wavelength λv of the VCSEL, as compared with a case where the resonance due to the effect of the setting thyristor S has the same resonant wavelength as the resonance of the VCSEL.

Second Exemplary Embodiment

The second exemplary embodiment is different from the first exemplary embodiment in the following point. The laminated structure L2 includes an intermediate layer 89 provided between the semiconductor laminate Lv and the semiconductor laminate Ls, and the laminated structure L2 can be adjusted by adjusting a thickness of the intermediate layer 89.

Figure 11A:
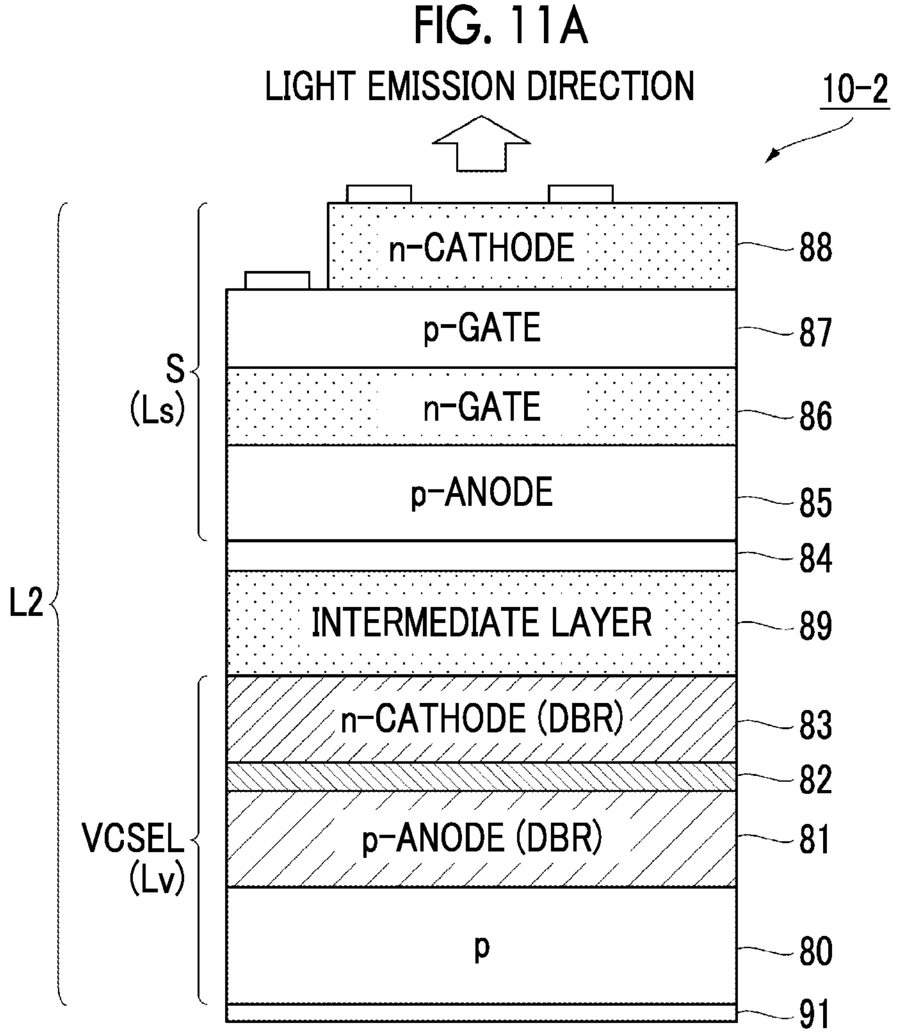
FIGS. 11A and 11B are diagrams each showing a light emitting chip and a semiconductor-laminated substrate according to a second exemplary embodiment.
Figure 11B:
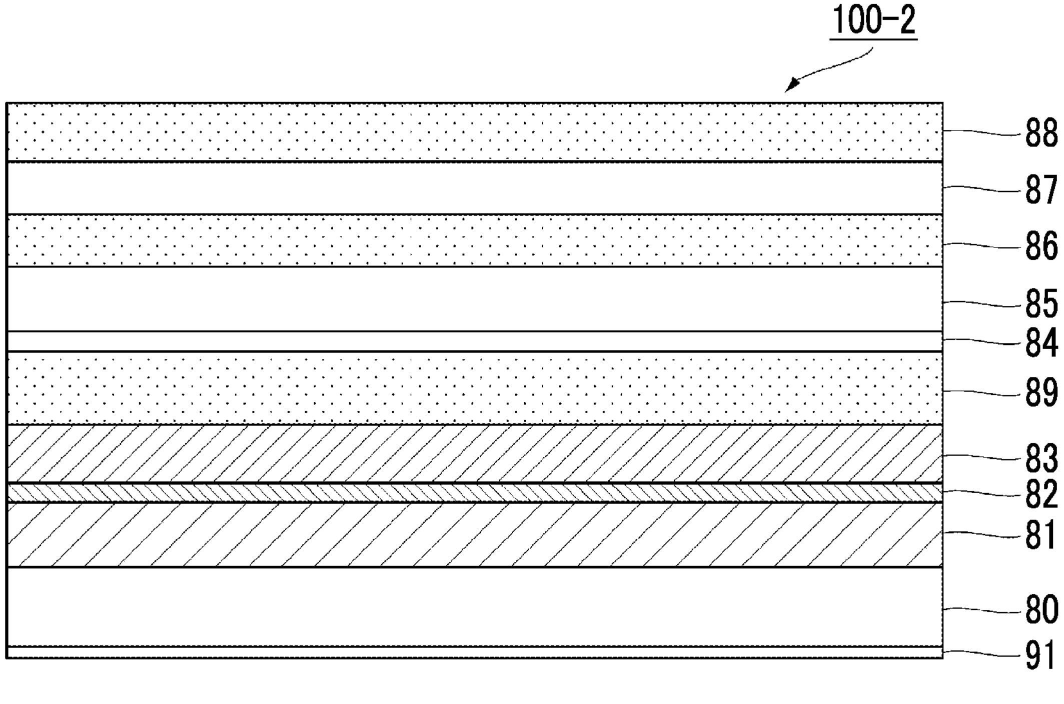

FIGS. 11A and 11B are diagrams each showing a light emitting chip 10-2 and a semiconductor-laminated substrate 100-2 according to the second exemplary embodiment. FIG. 11A is an enlarged cross-sectional view of the island on which the VCSEL and the setting thyristor S are laminated in the light emitting chip 10-2 according to the second exemplary embodiment, and FIG. 11B is a diagram showing the laminated structure L2 of the semiconductor-laminated substrate 100-2 according to the second exemplary embodiment. In FIGS. 11A and 11B, the same parts as the parts in FIGS. 4 and 6C are designated by the same reference numerals and the description thereof will not be repeated.

It should be noted that, in FIG. 11A, in a similar manner to the light emitting chip 10 according to the first exemplary embodiment shown in FIG. 4, the p-ohmic electrode 331 is shown and the protective layer 90 is omitted.

As shown in FIG. 11A, the light emitting chip 10-2 has a laminated structure L2 including the semiconductor laminate Lv constituting the VCSEL, the tunnel junction layer 84, the intermediate layer 89, and the semiconductor laminate Ls constituting the setting thyristor S.

The intermediate layer 89 is not limited as long as the intermediate layer 89 is able to maintain an electrical connection between the VCSEL and the setting thyristor S. GaInP, GaAs, AlGaAs, or the like may be used, and as a material capable of maintaining an electrical connection, for example, a material having an impurity concentration of about $10^{17}/cm^3$ to $10^{20}/cm^3$ is used. However, an n-type semiconductor usually has a smaller resistivity than a p-type semiconductor. Therefore, by making the intermediate layer 89 constituted by an n-type semiconductor, a driving voltage of the VCSEL may be decreased as compared with a case where the intermediate layer 89 is constituted by a p-type semiconductor.

A position where the intermediate layer 89 is provided may be between the semiconductor laminate Lv and the semiconductor laminate Ls, and may be above or below the tunnel junction layer 84.

FIG. 11A shows, as an example, an example in which the intermediate layer 89 made of one n-type semiconductor is provided below the tunnel junction layer 84. It should be noted that the thickness of the intermediate layer 89 is greater than the thicknesses of the n-gate layer 86 and the p-gate layer 87 of the setting thyristor S. Further, the p-anode layer 85 and the n-cathode layer 88 are thicker than the p-anode layer 85 and the n-cathode layer 88. That is, in a case where the thickness of each layer in the semiconductor laminate Ls constituting the setting thyristor S is represented as t(i) using the reference numeral i of each semiconductor layer, t(86), t(87)<t(85), t(88)<t(89). A magnitude relationship of the thickness of each layer is the same for the semiconductor-laminated substrate 100-2 shown in FIG. 11B.

The light emitting chip 10-2 is manufactured by processing the semiconductor-laminated substrate 100-2 shown in FIG. 11B. In the example in the drawing, the semiconductor-laminated substrate 100-2 is different from the semiconductor-laminated substrate 100 only in that the semiconductor-laminated substrate 100-2 has the intermediate layer 89. Consequently, in order to manufacture the semiconductor-laminated substrate 100-2, in the (1) manufacturing step of the semiconductor-laminated substrate described with reference to FIG. 6, after (1-1) the step of forming the semiconductor laminate Lv and before (1-3) the step of forming the semiconductor laminate Ls, the step of forming the intermediate layer 89 may be provided.

Further, the processing from the semiconductor-laminated substrate 100-2 to the light emitting chip 10-2 may be performed in the same manner as (2) the processing step of the light emitting chip described with reference to FIGS. 9A to 10F.

Here, in the semiconductor-laminated substrate 100-2 according to the second exemplary embodiment, the laminated structure L2 is adjusted by adjusting the thickness of the intermediate layer 89. As a result, the two resonant wavelengths λs1 and λs2 due to the effect of the setting thyristor S are located on both sides of the resonant wavelength λv of the VCSEL. In addition, in the example shown in FIGS. 11A and 11B, the laminated structure L2 is adjusted by adjusting both the thickness of the intermediate layer 89 and the thickness of the p-anode layer 85 and the n-cathode layer 88. It should be noted that the laminated structure L2 may be adjusted by adjusting the thickness of the intermediate layer 89 or the like by using the same procedure as in the first exemplary embodiment.

In such a manner, the effect on the characteristics of the setting thyristor S is suppressed as compared with a case where only the thickness of the semiconductor layer constituting the semiconductor laminate Ls is adjusted by adjusting the thickness of the intermediate layer 89 to adjust the laminated structure L2.

As described above, in the example shown in FIGS. 11A and 11B, the intermediate layer 89 is thicker than the n-gate layer 86 and the p-gate layer 87, and further thicker than the p-anode layer 85 and the n-cathode layer 88. As described above, in the adjustment of the laminated structure L2, by increasing the range of adjustment by the intermediate layer 89, the effect on the characteristics of the setting thyristor S is further suppressed.

Further, the thickness of the intermediate layer 89 may be adjusted without adjusting the thicknesses of the p-anode layer 85 and the n-cathode layer 88. Also in such a case, the effect on the characteristics of the setting thyristor S is suppressed.

Furthermore, the thicknesses of the n-gate layer 86 and the p-gate layer 87 may be adjusted.

Also in the second exemplary embodiment, as in the first exemplary embodiment, for example, the laminated structure L2 may be adjusted such that the resonant wavelength λv of the VCSEL is located in a range of ±30% from the average M of the two resonant wavelengths λs1 and λs2 due to the effect of the setting thyristor S (refer to FIG. 7B).

Also in the method for manufacturing the semiconductor-laminated substrate 100-2, the light emitting chip 10-2, and the semiconductor-laminated substrate 100 according to the second exemplary embodiment, in a similar manner to the first exemplary embodiment, it is easy to grasp the resonant wavelength λv of the VCSEL, as compared with a case where the resonance of the VCSEL and the resonance due to the effect of the setting thyristor S have the same resonant wavelength. Further, the same effect is obtained in the light emitting device 1 and the measurement apparatus 1000 in which the light emitting chip 10-2 is applied instead of the light emitting chip 10.

The semiconductor-laminated substrate 100 according to the first exemplary embodiment and the semiconductor-laminated substrate 100-2 according to the second exemplary embodiment each include the substrate 80 and the laminated structures L1 and L2 including the semiconductor laminate Lv provided on the substrate 80 and processed into the VCSEL and the semiconductor laminate Ls processed into the setting thyristor S. The semiconductor-laminated substrate 100 and the semiconductor-laminated substrate 100-2 may be a semiconductor-laminated substrate in which the laminated structures L1 and L2 are adjusted such that the two resonant wavelengths λs1 and λs2 due to the effect of the setting thyristor S are located on both sides of the resonant wavelength λv of the VCSEL.

Modification Example, and the Like

In the first and second exemplary embodiments described above, the tunnel junction layer 84 is provided between the semiconductor laminate Lv and the semiconductor laminate Ls. The tunnel junction layer 84 is not a necessary configuration. For example, instead of the tunnel junction layer 84, a layer of the group III-V compound having metallic conductivity may be provided.

Further, the laminated structure of the semiconductor-laminated substrate or the like according to the exemplary embodiment of the present invention is not limited to the above. Other layers may be added or some layers may be excluded as long as there is no contradiction.

Further, in the first exemplary embodiment and the second exemplary embodiment, the protective layer 90 is provided with the light emitting port 90A, and the light emitted by the VCSEL is emitted through the light emitting port 90A. Depending on the composition of the tunnel junction layer 84 and the semiconductor layer constituting the setting thyristor S, a part of the light from VCSEL may be reflected or absorbed by the tunnel junction layer 84 and the setting thyristor S, and the light extraction efficiency may decrease.

Therefore, in the first exemplary embodiment and the second exemplary embodiment, the semiconductor layer constituting the setting thyristor S, the tunnel junction layer 84, and the intermediate layer 89 may be removed through etching in the lower portion of the light emitting port 90A, and the VCSEL may be exposed. It should be noted that in a case where the intermediate layer 89 is provided immediately above the VCSEL as in the example of FIG. 11, GaInP or the like may be used for the intermediate layer 89, and the intermediate layer 89 may be used as a so-called etching stop layer.

The measurement apparatus 1000 can be applied to measure the three-dimensional shape of the target object, measure the distance to the target object, and recognize the target object from the specified three-dimensional shape. For example, the measurement apparatus 1000 is mounted on a portable information processing apparatus or the like and is used for recognizing a face of a user who intends to access the apparatus. That is, the information processing apparatus is permitted to be used only in a case where the three-dimensional shape of the face of the accessing user is acquired, whether or not the access is permitted is identified, and the user is recognized as the user who is permitted to access the information processing apparatus. The measurement apparatus 1000 can also be applied to a case where a three-dimensional shape of the target object is continuously measured, such as augmented reality (AR) technique.

Further, an applicable range of the light emitting device 1 is not limited to the measurement apparatus, and the light emitting device 1 may be applied to various applications as a light source.

Although the exemplary embodiments of the present invention have been described above, the technical scope of the present invention is not limited to the scope described in the above exemplary embodiments. It is clear from the description of the scope of claims that a combination of the above-mentioned exemplary embodiments and a combination of the above-mentioned exemplary embodiments with various changes or improvements are also included in the technical scope of the present invention.

Supplementary Note (((1)))

A semiconductor-laminated substrate comprising:

a substrate; and a laminated structure that includes a first semiconductor laminate which is provided on the substrate and processed into a light emitting element and a second semiconductor laminate which is provided on the first semiconductor laminate and processed into at least one thyristor, wherein the laminated structure is adjusted such that two resonant wavelengths due to an effect of the thyristor are located on both sides of a resonant wavelength of the light emitting element.

(((2)))

The semiconductor-laminated substrate according to (((1))), wherein the laminated structure is adjusted by adjusting a thickness of at least one layer of the second semiconductor laminate.

(((3)))

The semiconductor-laminated substrate according to (((2))), wherein the second semiconductor laminate includes at least an anode layer, a first gate layer, a second gate layer, and a cathode layer, and the laminated structure is adjusted by adjusting a thickness of at least one of the anode layer or the cathode layer of the second semiconductor laminate.

(((4)))

The semiconductor-laminated substrate according to (((3))), wherein the laminated structure is adjusted by making at least one of the anode layer or the cathode layer thicker than the first gate layer and the second gate layer.

(((5)))

The semiconductor-laminated substrate according to any one of (((1))) to (((4))), wherein the laminated structure includes an intermediate layer provided between the first semiconductor laminate and the second semiconductor laminate, and the laminated structure is adjusted by adjusting a thickness of the intermediate layer.

(((6)))

The semiconductor-laminated substrate according to (((5))), wherein the intermediate layer is constituted by an n-type semiconductor.

(((7)))

The semiconductor-laminated substrate according to any one of (((1))) to (((6))), wherein the laminated structure is adjusted such that the resonant wavelength of the light emitting element is located within a range of ±30% from an average of the two resonant wavelengths due to the effect of the thyristor in a case where a distance between the two resonant wavelengths due to the effect of the thyristor is 100%.

(((8)))

Alight emitting component comprising:

a substrate on which a laminated structure including a first semiconductor laminate and a second semiconductor laminate overlapping with the first semiconductor laminate is formed;

at least one light emitting element that is constituted by the first semiconductor laminate; and at least one thyristor that is constituted by the second semiconductor laminate and that causes the light emitting element to emit light or increase an amount of light emitted by turning on the light emitting element, wherein the laminated structure is adjusted such that two resonant wavelengths due to an effect of the thyristor are located on both sides of a resonant wavelength of the light emitting element.

(((9)))

A light emitting device comprising:

a substrate on which a laminated structure including a first semiconductor laminate and a second semiconductor laminate overlapping with the first semiconductor laminate is formed;

a light emitting unit that has at least one light emitting element constituted by the first semiconductor laminate;

a driving unit that includes at least one thyristor constituted by the second semiconductor laminate and drives the light emitting element; and wherein the laminated structure is adjusted such that two resonant wavelengths due to an effect of the thyristor are located on both sides of a resonant wavelength of the light emitting element.

(((10)))

A measurement apparatus comprising:

a substrate on which a laminated structure including a first semiconductor laminate and a second semiconductor laminate overlapping with the first semiconductor laminate is formed;

a light emitting unit that has at least one light emitting element constituted by the first semiconductor laminate;

a driving unit that includes at least one thyristor constituted by the second semiconductor laminate and drives the light emitting element; and a measurement unit that performs measurement on a target object on the basis of light emitted from the light emitting unit and reflected by the target object, wherein the laminated structure is adjusted such that two resonant wavelengths due to an effect of the thyristor are located on both sides of a resonant wavelength of the light emitting element.

(((11)))

A method of manufacturing semiconductor-laminated substrate comprising:

a first laminate formation step of forming a first semiconductor laminate processed into at least one light emitting element on a substrate; and a second laminate formation step of forming a second semiconductor laminate processed into at least one thyristor on the first semiconductor laminate formed by the first laminate formation step, wherein in the second laminate formation step, a semiconductor layer is formed which has a thickness determined such that two resonant wavelengths due to an effect of the thyristor are located on both sides of the resonant wavelength of the light emitting element.

(((12)))

A method of manufacturing semiconductor-laminated substrate comprising:

a first laminate formation step of forming a first semiconductor laminate processed into at least one light emitting element on a substrate; and an intermediate layer formation step of forming an intermediate layer on the first semiconductor laminate formed by the first laminate formation step; and a second laminate formation step of forming a second semiconductor laminate processed into at least one thyristor on the intermediate layer formed by the intermediate layer formation step, wherein in the intermediate layer formation step, the intermediate layer is formed which has a thickness determined such that two resonant wavelengths due to the effect of the thyristor are located on both sides of the resonant wavelength of the light emitting element.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor-laminated substrate comprising:

a substrate; and a laminated structure that includes a first semiconductor laminate which is provided on the substrate and processed into a light emitting element and a second semiconductor laminate which is provided on the first semiconductor laminate and processed into at least one thyristor, wherein the laminated structure is adjusted such that two resonant wavelengths due to an effect of the thyristor are located on both sides of a resonant wavelength of the light emitting element, wherein, in a reflectance spectrum obtained by irradiating the laminated structure and detecting reflected light, the two resonant wavelengths due to the effect of the thyristor are observed, after formation of the second semiconductor laminate, as two depressions in the reflectance spectrum, wherein one of the two resonant wavelengths is shorter than the resonant wavelength of the light emitting element and the other is longer than the resonant wavelength of the light emitting element.

2. The semiconductor-laminated substrate according to claim 1, wherein the laminated structure is adjusted by adjusting a thickness of at least one layer of the second semiconductor laminate.

3. The semiconductor-laminated substrate according to claim 2, wherein the second semiconductor laminate includes at least an anode layer, a first gate layer, a second gate layer, and a cathode layer, and the laminated structure is adjusted by adjusting a thickness of at least one of the anode layer or the cathode layer of the second semiconductor laminate.

4. The semiconductor-laminated substrate according to claim 3, wherein the laminated structure is adjusted by making at least one of the anode layer or the cathode layer thicker than the first gate layer and the second gate layer.

5. The semiconductor-laminated substrate according to claim 1, wherein the laminated structure includes an intermediate layer provided between the first semiconductor laminate and the second semiconductor laminate, and the laminated structure is adjusted by adjusting a thickness of the intermediate layer.

6. The semiconductor-laminated substrate according to claim 5, wherein the intermediate layer is constituted by an n-type semiconductor.

7. The semiconductor-laminated substrate according to claim 1, wherein the laminated structure is adjusted such that the resonant wavelength of the light emitting element is located within a range of ±30% from an average of the two resonant wavelengths due to the effect of the thyristor in a case where a distance between the two resonant wavelengths due to the effect of the thyristor is 100%.

8. A light emitting component comprising:

a substrate on which a laminated structure including a first semiconductor laminate and a second semiconductor laminate overlapping with the first semiconductor laminate is formed;

at least one light emitting element that is constituted by the first semiconductor laminate; and at least one thyristor that is constituted by the second semiconductor laminate and that causes the light emitting element to emit light or increase an amount of light emitted by turning on the light emitting element, wherein the laminated structure is adjusted such that two resonant wavelengths due to an effect of the thyristor are located on both sides of a resonant wavelength of the light emitting element, wherein, in a reflectance spectrum obtained by irradiating the laminated structure and detecting reflected light, the two resonant wavelengths due to the effect of the thyristor are observed, after formation of the second semiconductor laminate, as two depressions in the reflectance spectrum, wherein one of the two resonant wavelengths is shorter than the resonant wavelength of the light emitting element and the other is longer than the resonant wavelength of the light emitting element.

9. A measurement apparatus comprising:

a substrate on which a laminated structure including a first semiconductor laminate and a second semiconductor laminate overlapping with the first semiconductor laminate is formed;

a light emitting unit that has at least one light emitting element constituted by the first semiconductor laminate;

a driving unit that includes at least one thyristor constituted by the second semiconductor laminate and drives the light emitting element; and a measurement unit that performs measurement on a target object on the basis of light emitted from the light emitting unit and reflected by the target object, wherein the laminated structure is adjusted such that two resonant wavelengths due to an effect of the thyristor are located on both sides of a resonant wavelength of the light emitting element, wherein, in a reflectance spectrum obtained by irradiating the laminated structure and detecting reflected light, the two resonant wavelengths due to the effect of the thyristor are observed, after formation of the second semiconductor laminate, as two depressions in the reflectance spectrum, wherein one of the two resonant wavelengths is shorter than the resonant wavelength of the light emitting element and the other is longer than the resonant wavelength of the light emitting element.

* * * * *